(12) United States Patent
Roberts

(10) Patent No.: US 9,753,081 B2
(45) Date of Patent: Sep. 5, 2017

(54) MUXING INTERFACE PLATFORM FOR MULTIPLEXED HANDLERS TO REDUCE INDEX TIME SYSTEM AND METHOD

(75) Inventor: Howard Roberts, Austin, TX (US)

(73) Assignee: CELERINT, LLC, New York, NY (US)

( * ) Notice: Subject to any disclaimer, the term of this patent is extended or adjusted under 35 U.S.C. 154(b) by 281 days.

(21) Appl. No.: 13/022,341

(22) Filed: Feb. 7, 2011

(65) Prior Publication Data

US 2011/0204914 A1  Aug. 25, 2011

Related U.S. Application Data

(60) Provisional application No. 61/301,925, filed on Feb. 5, 2010, provisional application No. 61/301,931, filed on Feb. 5, 2010, provisional application No. 61/319,338, filed on Mar. 31, 2010, provisional application No. 61/319,347, filed on Mar. 31, 2010.

(51) Int. Cl.
*G01R 31/00* (2006.01)
*G01R 31/28* (2006.01)
*G01R 1/073* (2006.01)

(52) U.S. Cl.
CPC ..... *G01R 31/2834* (2013.01); *G01R 31/2889* (2013.01); *G01R 1/07385* (2013.01)

(58) Field of Classification Search
CPC .......... G01R 31/31926; G01R 31/2884; G01R 31/2886; G01R 31/2889
USPC .... 324/756.01, 756.02, 756.03, 756.07, 73.1
See application file for complete search history.

(56) References Cited

U.S. PATENT DOCUMENTS

| | | | | |
|---|---|---|---|---|
| 5,025,205 A | * | 6/1991 | Mydill et al. | 324/73.1 |
| 5,414,858 A | * | 5/1995 | Hoffman et al. | 710/48 |
| 5,968,193 A | * | 10/1999 | Ang | 714/724 |
| 5,970,241 A | * | 10/1999 | Deao | G06F 11/3632 712/227 |
| 6,225,798 B1 | * | 5/2001 | Onishi et al. | 324/750.01 |
| 6,937,006 B2 | * | 8/2005 | West | 324/750.01 |
| 6,958,617 B1 | * | 10/2005 | Rhodes | G01R 31/31905 324/756.02 |
| 7,388,390 B2 | * | 6/2008 | Brueckner et al. | 702/118 |
| 2004/0143411 A1 | * | 7/2004 | Wu | 702/117 |
| 2005/0235263 A1 | * | 10/2005 | Bundy | G06F 11/263 717/124 |
| 2006/0288349 A1 | * | 12/2006 | Zimmer et al. | 718/107 |

(Continued)

*Primary Examiner* — Huy Q Phan
*Assistant Examiner* — Adam Clarke
(74) *Attorney, Agent, or Firm* — Greenblum & Bernstein, P.L.C.

(57) ABSTRACT

A system for connecting a test pin of automatic test equipment (ATE) to devices for testing includes a first handler for manipulating a first portion of the devices and a second handler for manipulating a second portion of the devices. The system includes a first socket for testing devices of the first portion, which is connected to a first wire, and a second socket for testing devices of the second portion, which is connected to a the second wire. A controller multiplexes the two handlers, or dual manipulators of a single handler, to operate the handlers asynchronously in coordination with testing, such that while the ATE is testing devices for one handler, the other handler presents next devices to the ATE for immediate switch of testing between devices for each handler. The system is suitable for conventional handlers and ATE.

13 Claims, 10 Drawing Sheets

(56) References Cited

U.S. PATENT DOCUMENTS

2007/0063724 A1* 3/2007 Roberts et al. ............... 324/765
2007/0184546 A1* 8/2007 Farrelly et al. ............ 435/286.3
2007/0271058 A1* 11/2007 Brueckner ............ G01R 31/01
　　　　　　　　　　　　　　　　　　　　　702/118
2008/0007285 A1* 1/2008 Nakase et al. ................ 324/765

* cited by examiner

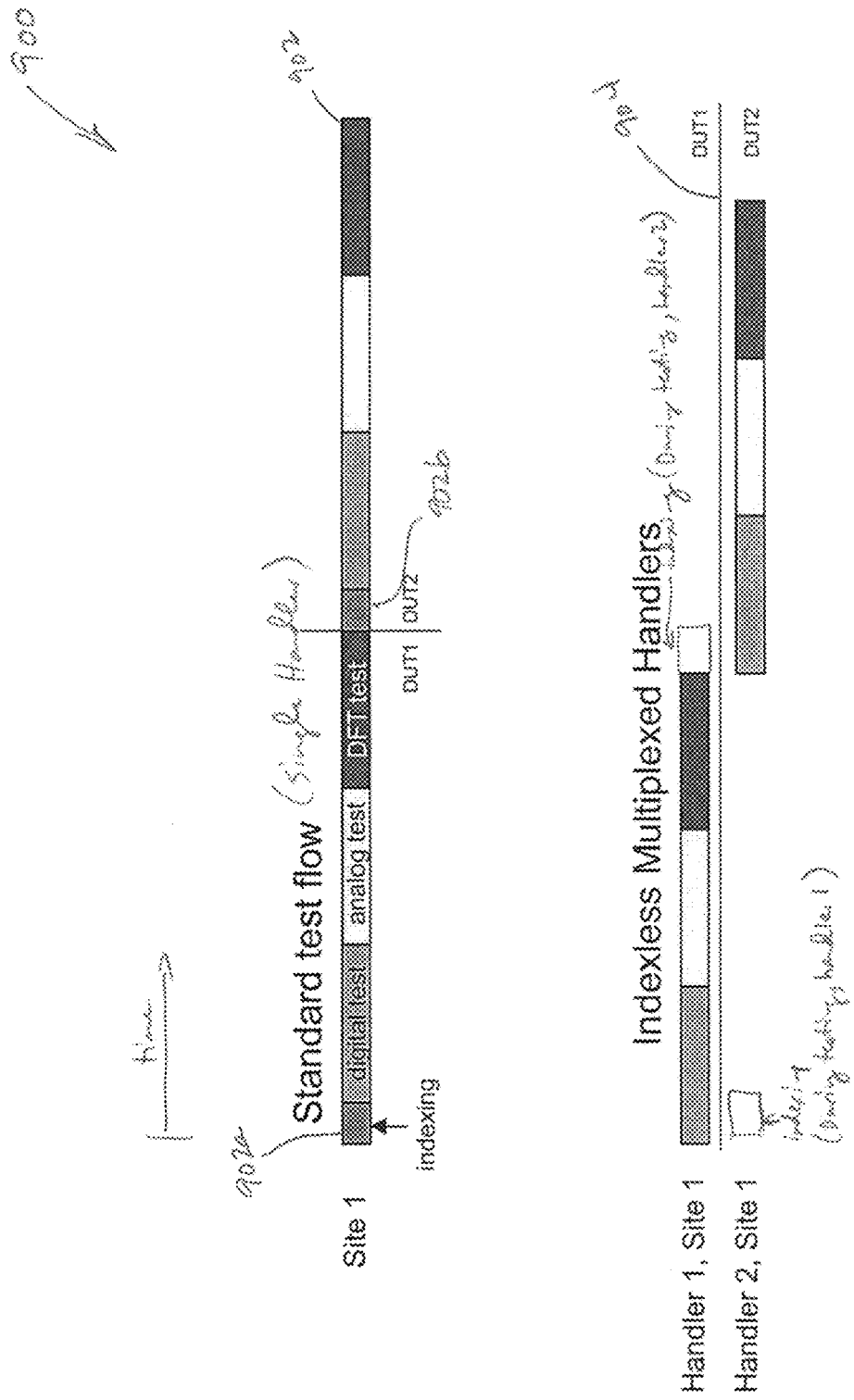

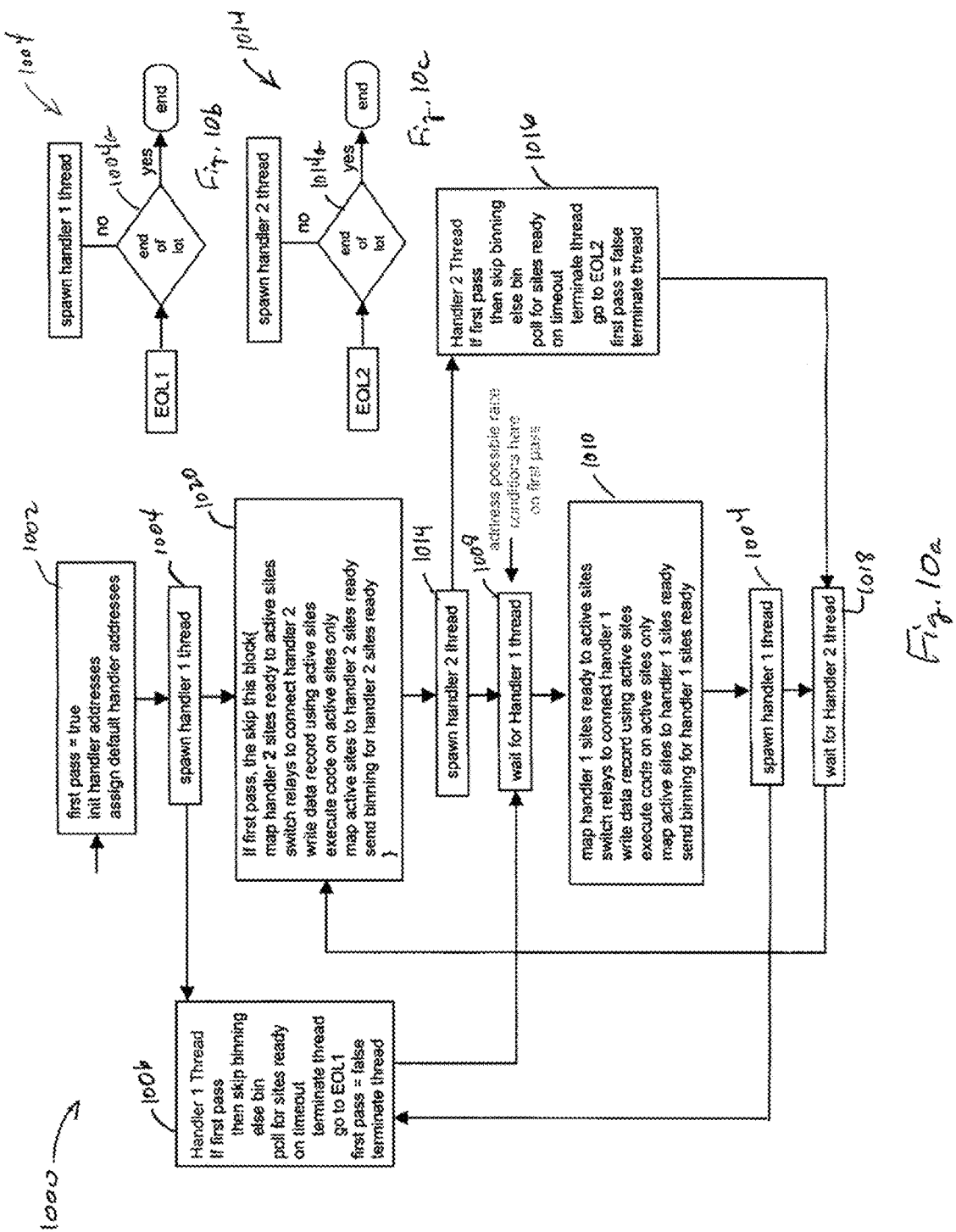

MUXING INTERFACE PLATFORM FOR MULTIPLEXED HANDLERS TO REDUCE INDEX TIME SYSTEM AND METHOD

CROSS-REFERENCE TO RELATED APPLICATIONS

The present application is a conversion of and has benefit of priority of the following applications, which are at least one same inventor of the present application: U.S. Provisional Patent Application No. 61/301,925, titled "Multiplexed Handler Platform For Reduced Index Time", filed Feb. 5, 2010; U.S. Provisional Patent Application No. 61/301,931, titled "Universal Multiplexing Interface", filed Feb. 5, 2010; U.S. Provisional Patent Application No. 61/319,338, titled "Modular Test Head Specific Universal Interface", filed Mar. 31, 2010; and U.S. Provisional Patent Application No. 61/319,347, titled "Dynamically Expanded Test System and Method: DEPT and DECT", filed Mar. 31, 2010. The present application is related to U.S. patent application Ser. No. 13/022,383, titled "UNIVERSAL MULTIPLEXING INTERFACE SYSTEM AND METHOD", filed concurrently on the same date herewith and having at least one same inventor of the present application, which related application is by this reference hereby incorporated herein.

TECHNICAL FIELD

The present invention is related to automatic test equipment and robotic handlers and is more particularly related to a platform system for multiplexing more than one handler for reducing index time and efficient resource utilization in automatic test equipment.

BACKGROUND

Manufacturing and production industries use automatic test equipment (ATE) to analyze and assess integrity and operability of manufactured products at various stages of production. Robotic manipulator machines are often employed during testing by ATE to manipulate workpieces and products into and out of connection with the ATE. The devices under test (DUTs) are presented to a test site of the ATE by the robotic machine, tested by the ATE, and then sorted and dispensed by the robotic machine into groups or bins (or otherwise according to applicable scheme) according to test results. Because many diverse types of DUTs are tested by ATEs, and DUTs may be tested at various stages of production (e.g., final test, workpiece probe, etc.), ATEs are varied in design according to particular purpose and device or product for testing. Similarly, robotic manipulator machines vary according to application and compatibility with the ATE.

Although varied, ATEs and robotic manipulators each usually include several typical operational units. ATEs and robotic manipulators are widely used, for example, in the production of electronic products, such as analog and digital components, circuits and devices (including semiconductors, integrated circuits, microprocessors, and the like). Because of this prevalence, the typical operational units of ATEs and robotic manipulators for such products are described.

The ATE includes a system controller which controls the system and movement of data into and out of the system. The ATE also includes test data and test program storage, pattern memory, system power supplies, direct current reference supply unit, analog current reference supply unit, system clocks and calibration circuits, timing and timeset memory, and precision measurement unit (which may include digital, analog or mixed signal test resource circuitry). In addition, a test head of the ATE includes pin electronics driver cards providing pin circuitry (such as for comparators, current loads and other test resources) for pin electronics testing of DUTs. A device interface board (DIB) (also referred to as "load board") connects to the test head and provides connection socket(s) for the DUT or DUTs, as applicable. The ATE also includes external interfaces for connection to robotic manipulators for test devices (referred to as "handlers" or "device handlers"), as well as interfaces to computers, networks, and/or other instruments, devices or components.

Robotic manipulators, i.e., handlers, include mechanical systems and controllers. The mechanical systems physically deliver DUTs for presentation to the socket(s) of the DIB connected to the test head of the ATE, deposit the DUTs in the socket(s) during testing, remove the DUTs from the socket(s) post testing, and sort the DUTs according to respective test result after testing. The controller directs operations of the mechanical systems of the handler and communicates with the ATE. As required, handlers can include additional features of memory and specific units according to application and testing environment.

In conventional testing of devices by an ATE and mechanical manipulation of devices by a handler, the ATE commences testing each device when deposited by the handler in a socket of the DIB connected to the test head. When testing is completed, the handler must remove the tested device from the socket and transport a next device to the socket for testing. The time delay between testing by the ATE, during which devices are removed and transported from sockets and next devices are transported to and deposited in sockets, is referred to as "index time" for the test operation. Further in conventional testing of devices by an ATE, the time required to test each device once deposited in a socket is referred to as "tester time" for the test operation. When testing a batch of devices, the total time required for the testing operation is the aggregate of the index time plus the tester time for all of the devices and each device (or set of devices, if more than one device can be concurrently tested by the ATE in available sockets of the DIB) requires the sum of the index time plus the tester time for testing of the device. Although testing operations can also require additional time, for example, because of downtime of equipment, faults, or other impediments to continuous testing sequence, these are irregular and uncertain events that are not necessarily controllable.

Therefore, reducing the total test time (index time plus tester time) is desirable. Testing operations can require significant amounts of time, effort and expense, including for personnel and ATE and handler equipment. ATEs are typically expensive because comprised of complex electronics. Handlers are generally less expensive than ATEs because comprised of mechanical pieces controlled by less complex electronics. In efforts to receive greater returns on investments in ATEs and handlers, companies operating the equipment desire that idle times (periods of no testing) for this equipment be limited. With ATEs and handlers, therefore, a reduction of total test time (index time plus tester time) can provide significant advantage. For example, if total test time is reduced, more testing can be performed by each piece of equipment and same personnel during any period, leading to greater investment return.

Moreover, handlers in particular, and ATEs as well but less so, become outdated and less useful. With handlers, focus of development has generally been towards increased mechanical operation speed for reducing index time during testing. Focus of development for ATEs has been directed more often to newer or additional test capabilities or capacities, which may in fact increase, rather than decrease, tester time. It would be desirable to provide handler and ATE equipment for reducing total test time.

A primary focus in handler development has been to increase speed of mechanical structures, such as arms, chucks, guides, cams and the like, in order to obtain shorter index times. Because handlers are generally less expensive than ATEs, older handler models are replaced with newer speedier models. Older handlers become idle and obsolete. Handler mechanical failure is a significant source of testing downtime, therefore, excess handlers are often maintained as backup equipment but stand idle during periods not in use with ATE for testing operations. It would be desirable to reduce total test time by more effective and efficient use of ATEs and available handlers.

It would, therefore, be advantageous to reduce total test time for testing by reducing index time of handler/robotic manipulator operations. It would also be advantageous to efficiently use ATE resources and available handlers to put to use idle equipment, maximize use of equipment capabilities, take advantage of available capacity (including capacity from existing older equipment), and consequently provide better return on investment. Therefore, a platform system for reducing total test time, by decreasing handler index time and efficiently using automatic test equipment resources, would be a significant improvement in the art and technology.

SUMMARY

An embodiment of the invention is a system for testing first devices and second devices via automatic test equipment (ATE). The system includes a first load board including a first socket for connecting to at least one of the first devices for testing, a first handler for connecting at least one of the first devices to the first socket and disconnecting the first devices on completion of testing, and successively continuing and disconnecting until all of the first devices are tested, a second handler for connecting at least one of the second devices to the second socket and disconnecting the second devices on completion of testing, and successively continuing and disconnecting until all of the second devices are tested. The system also includes a tester interface board communicatively connected to the ATE. The tester interface board communicatively connects the ATE to either the first socket or the second socket. A controller of the system is connected to the first handler and the second handler and communicatively connected to the tester interface board. The controller polls the first handler to detect whether any first device is connected by the first handler to the first socket for testing and polls the second handler to detect whether any second device is connected by the second handler to the second socket for testing. The controller switches connection of the ATE to the first socket for testing if any first device connected by the first handler to the first socket is detected, unless the ATE is then connected to the second socket during testing, and to the second socket for testing if any second device connected by the second handler to the second socket is detected, unless the ATE is connected to the first socket during testing.

Another embodiment of the invention is a system for connecting a test pin of an ATE to devices for testing. The system includes a first handler for manipulating a first portion of the devices and a second handler for manipulating a second portion of the devices. The system also includes a first wire, a second wire, a relay communicatively connected to the test pin and switchably communicatively connected to either the first wire or the second wire, a first socket communicatively connected to the first wire, the first handler being capable of connecting at least one device of the first portion to the first socket, a second socket communicatively connected to the second wire, the second being handler capable of connecting at least one device of the second portion to the second socket, and a controller communicatively connected to the first handler, the second handler, and the relay. The relay switches communicative connection to the first wire if the first handler has connected at least one device of the first portion to the first socket and the ATE is not then communicatively connected to and testing at least one device of the second portion in the second socket, and the relay switches communicative connection to the second wire if the second handler has connected at least one device of the second portion to the second socket and the ATE is not then communicatively connected to and testing at least one device of the first portion in the first socket.

Yet another embodiment of the invention is an interface device for a tester. The tester has a plurality of pin electronics cards, which include a first part and a second part of the plurality. The first part provides a respective first test for testing of devices, and the second part providing a respective second test for testing of devices. The interface device includes a tester interface board capable of communicatively connecting to the plurality of pin electronics cards, each respective one of the plurality of pin electronics card being communicatively connected to one of a plurality of respective relays of the tester interface board, where the plurality of respective relays include a first portion and a second portion of the plurality of respective relays, a first device interface board capable of communicatively connecting to one or more of the devices, the first device interface board is communicatively connected to each one of the first portion of the plurality of respective relays, a second device interface board capable of communicatively connecting to one or more of the devices, the second device interface board is communicatively connected to each one of the second portion of the plurality of respective relays, and a controller connected to the tester interface board for switching the first portion of the respective relays to connect the tester to the first device interface board and the second portion of the respective relays to connect the tester to the second device interface board.

Another embodiment of the invention is a method of testing devices. The method includes a first test and a second test of a tester. The first test requires a first test period for completion, and the second test requires a second test period for completion. A first portion of devices is connected to the tester at a first interval, and the second portion of devices is connected to the tester at a second interval. The method includes connecting the first portion of devices in the first interval, for the first test, first polling to detect if the first portion of devices is connected in the first interval and if the first test is completed in the first test period, connecting the second portion of devices in the second interval, for the second test, second polling to detect if the second portion of devices is connected in the second interval and if the second test is completed in the second test period, communicatively connecting the first test to the first portion of devices if the step of first polling detects the first portion of devices connected in the first interval, communicatively connecting the second test to the second portion of devices if the step of second polling detects the second portion of devices connected in the second interval, and alternating, in succession, between the step of communicatively connecting the first test if the step of second polling detects the second test is completed and the step of communicatively connecting the first test if the step of second polling detects the second test is completed.

A method of connecting first devices and second devices to an automatic test equipment for testing of the first devices by a first test and testing of the second devices by a second test includes connecting an interface board to test pins of the automatic test equipment, connecting a first load board to the interface board, for the first test to the first device, connecting a second load board to the interface board, for the second test to the second device, providing a first handler, the first handler connects the first devices to the first load board, providing a second handler, the second handler connects the second devices to the second load board, controlling the first handler to connect the first devices to the first load board, controlling the second handler to connect the second devices to the second load board, switchingly connecting the first test to the first load board if the first devices are connected to the first load board, and switchingly connecting the second test to the second load board if the second devices are connected to the second load board. In the method, the step of switchingly connecting the first test to the first load board is performed only if either the first test and the second test have not yet been completed, the second test is completed, or at least one of the first devices has not been connected to the first load board in the step of controlling the first handler, and the step of switchingly connecting the second test to the second load board is performed only if the first test is completed or at least one of the second devices has not been connected to the second load board in the step of controlling the second handler.

BRIEF DESCRIPTION OF THE DRAWINGS

The present invention is illustrated by way of example and not limitation in the accompanying figures, in which like references indicate similar elements, and in which:

FIG. 9 illustrates an exemplary comparison of a test system associated with a single handler and of a test system associated with multiplexed handlers, according to certain embodiments of the invention; and FIGS. 10A-10C illustrate a method of controlling relays and handlers, according to certain embodiments of the invention.

DETAILED DESCRIPTION

Figure 1:
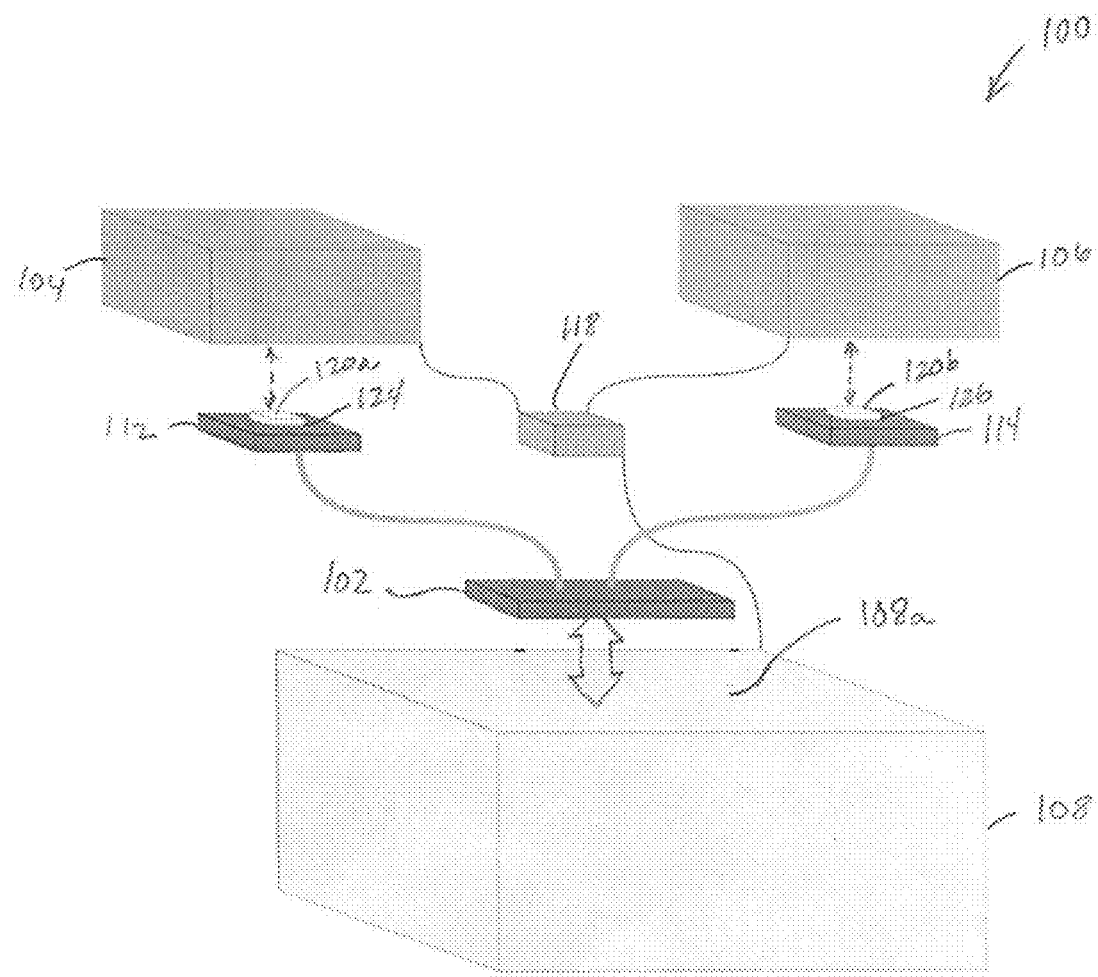
FIG. 1 illustrates a test system of a multiplexed tester device interface board and first and second handlers, according to certain embodiments of the invention.

Referring to FIG. 1, a system 100 includes a multiplexed tester device interface board (Tester DIB) 102 for multiplexing a first handler 104 and a second handler 106 to an automatic test equipment (ATE) 108. The ATE 108 is an electronic test equipment providing pluralities of individual and distinct tester resource circuits capable of connection to respective pin(s) of a device under test (DUT) via a load board (i.e., device interface board).

The Tester DIB 102 communicatively connects to a test head 108a of the ATE 108, for example, the Tester DIB 102 replaces a load board in connection to the test head of the ATE 108. The Tester DIB 102 also communicatively connects to one or more device interface boards (Device DIBs), for example, Device DIBS 112 and 114, each respectively supplied with respective DUTs by respective handlers, for example, by the first handler 104 as to Device DIB 112 and the second handler 106 as to Device DIB 114. The Tester DIB 102 relays test signals of each of the individual and distinct tester resource circuits between respective functionally same pin(s) of each of the Device DIBs 112 and 114, in response to communicatively connected control of the first handler 104 and the second handler 106 (and any commonly connected controller 118 between the ATE 108 and the first handler 104 and second handler 106, if applicable) with the ATE 108.

In operation of the system 100, each handler manipulates DUTs to and from a pin socket of its corresponding Device DIB (or to and from pin sockets, if more than one in the Device DIB and more than one DUT is simultaneously tested by the ATE via the Device DIB). For example, in the system 100 of FIG. 1 for testing a batch of DUTs (each DUT being the same or substantially the same, save for any minor physical differences resulting from manufacture processes; DUTs are identified by same reference number to indicate likeness but by different alphabetical letter for purposes of explanation), the first handler 104 transfers and deposits a DUT (or DUTs) 120a to a socket (or sockets) 124 of the Device DIB 112 for testing by the ATE 108. Relays of the Tester DIB 102 are switched to communicatively connect tester resource circuits of the ATE 108 to Device DIB 112 for testing at the socket 124 once the DUT 120 is deposited in the socket 124 (and any testing at the Device DIB 114 is completed, if applicable).

During testing of the DUT 120 in the socket 124, the second handler 106 transfers and deposits a DUT (or DUTs) 120b to a socket (or sockets) 126 of the Device DIB 114 for next testing by the ATE 108. Immediately upon completion of testing of the DUT 120a in the socket 124, relays of the Tester DIB 102 are switched to communicatively connect tester resource circuits of the ATE 108 to Device DIB 114 for testing at the socket 126. During testing of the DUT 120b in the socket 126, the DUT 120a is removed by the first handler 104 from the socket 124 and replaced with a next DUT for testing in the socket 124. Immediately upon completion of testing of the DUT 120b in the socket 126, relays of the Tester DIB 102 are switched back to communicatively connect tester resource circuits of the ATE 108 to Device DIB 112 for testing at the socket 124. During testing of this next DUT in the socket 124, the DUT 120b is removed by the second handler 106 from the socket 126 and replaced with a next successive DUT for testing at the socket 126 after completion of testing at the socket 124.

This successive process is continued, with each handler respectively connecting the DUTs to respective sockets and relays of the Device DIB 112 switching between sockets for continuous testing by the ATE, until all remaining DUTs for testing have been tested or the testing operation is otherwise halted.

Figure 2:
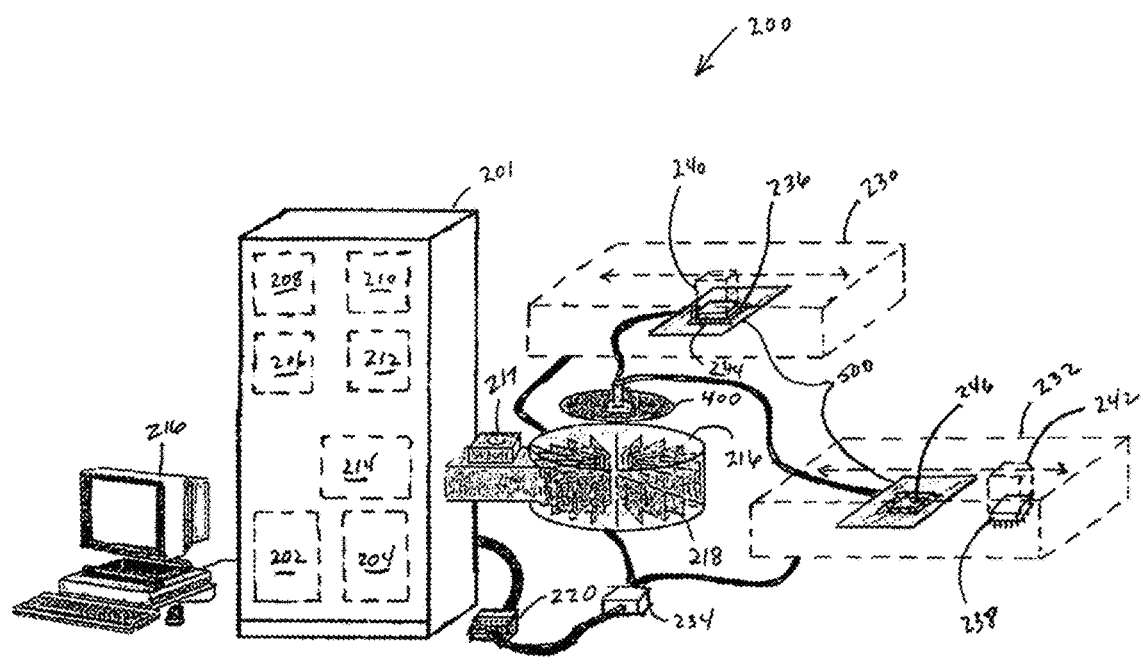
FIG. 2 illustrates an exemplary test system for testing electronic devices according, according to certain embodiments of the invention.

Referring to FIG. 2, an exemplary test system 200 for testing electronic devices, such as semiconductor devices, includes an automatic test equipment (ATE) 201. The ATE 201, includes a central controller 202. The controller 202 is communicatively connected to system power supplies 204, reference voltage supplies 206, system clocks and calibration circuits 208, timing and timeset memory 210, vector pattern storage memory 212, and a precision measurement unit 214 (each shown in phantom). The controller 202 may also be communicatively connected to a variety of special test units and other elements, for example, interface connectors for communicatively connecting to external instruments, computer(s) 216, data storage, communications network, test box/bin box 217 (e.g., for start/reset and pass/fail indicator) and others. The foregoing elements may be contained within one or more housing, may be segregated in various combinations in independent but communicatively connected housings, and/or may be communicatively connected via interface connectors for testing operation. The ATE 201 also includes or communicatively connects to a test head 216. The test head 216 provides pin electronics drivers, comparators, current loads, and other test channel functional circuitry, which may be included in one or more pin electronics card 218 (shown in phantom) communicatively connected to the test head 216. The ATE 201 is communicatively connectable, for example, by a docking connector 220, to a handler/manipulator robot for handling of devices for testing by the ATE 201.

A muxing tester interface device 400 is communicatively connected to the test head 216 of the ATE 201. Although not shown in detail in FIG. 2 (but shown in further detail in later Figures), the muxing tester interface device 400 fits atop the test head 216 in mating communicative connection to tester pins of the pin electronics cards 218. The muxing tester interface device 400 is an example of the Tester DIB of the system 100 of FIG. 1. The muxing tester interface device 400 communicatively connects to one or more device load boards 500. The load boards 500 are examples of the Device DIBs 114 and 116 of the system 100 of FIG. 1. One or more handlers 230 and 232 are communicatively connected to the docking connector 220 of the ATE 201. The system 200 can, if needed in the system 200, include a multiplex controller 234 communicatively connecting the handlers 230 and 232 to the ATE 201 via the docking connector 220 (or other connector). The handlers 230 and 232 transfer respective devices under test (DUTs) 236 and 238, such as via respective chuck 240, 242 of the handlers 230, 232, from test bins (not shown) into communicative connection to the respective load board 500 for the handler 230 or 232. In the illustration of FIG. 2, the handler 230 has deposited the DUT 236 in a test socket 244 of the load board 500 for the handler 230 for testing by the ATE 201 via connection of the load board 500 to the muxing tester interface device 400. Further in the illustration, the handler 232 has removed the DUT 238 from a test socket 246 of the load board 500 for the handler 232 after testing of the DUT 238 has been completed by the ATE 201 via the load board 500 in connection to the muxing tester interface device 400. Arrows "A" and "B" illustrate transit of DUTs 236, 238, respectively, into connection with respective test sockets 244, 246 for the respective handlers 230, 232.

Figure 3:
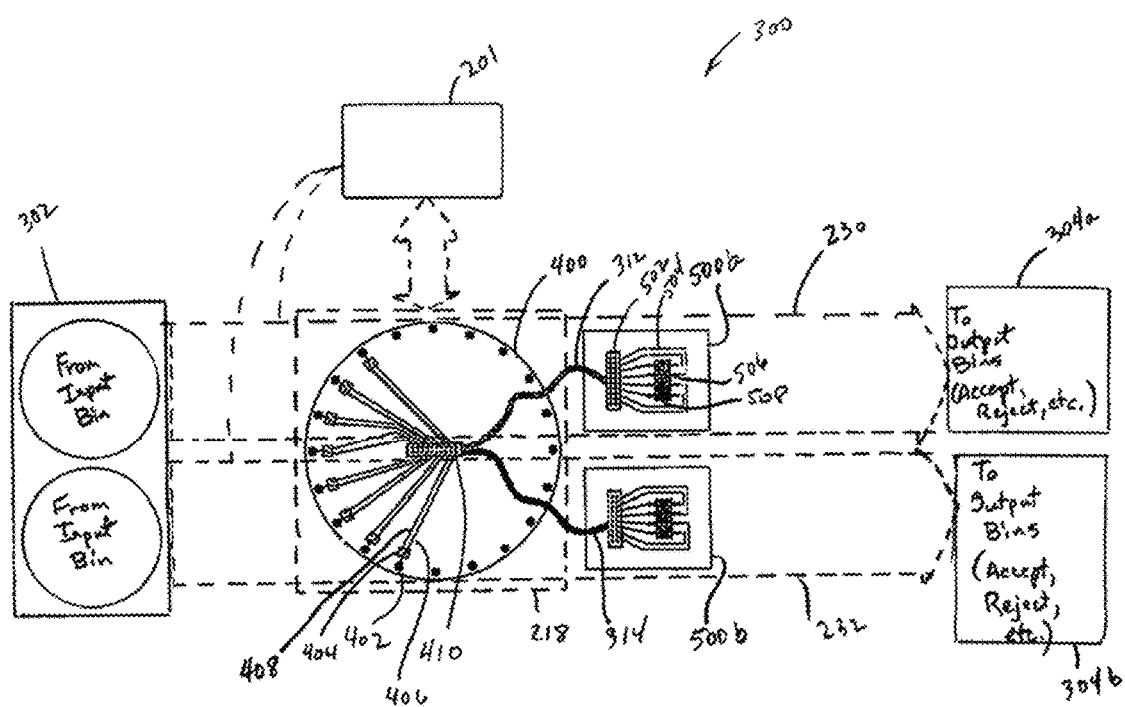
FIG. 3 illustrates a muxing tester interface device and mutltiplexed handlers serving for respective load boards of the exemplary test system of FIG. 2, according to certain embodiments of the invention.

Referring to FIG. 3 in conjunction with FIG. 2, the muxing tester interface device 400 connects to the test head 218 in same manner that a conventional load board (also referred to in the art as device interface board or DIB) with test socket(s) for DUT testing connects to the test head 218. The test head 218 need not be modified or changed from what is conventional when using the muxing tester interface device 400. Pin electronics circuitry of the test head 218, such as typically provided by pin electronics cards 218 contained in the test head 218 and in communicative connection to the ATE 201, remain as conventional for applicable testing of DUTs to be tested. Although pin electronics cards 218 widely vary in design and configuration depending on type of DUT, particular testing to be conducted, and design of the test head 216 of the ATE 201, no change is required to any pin electronics circuitry of the test head 216 in order to accommodate use of the muxing tester interface device 400 or its connection to the test head 216 in replacement for a conventional load board.

In effect, the muxing tester interface device 400 includes mating connectors 402 for attachment and communicative connection of the muxing tester interface device 400 to the test head 216. All pin electronics circuitry, such as provided by pin electronics cards 218 of the test head 216, mate for attachment and communicative connection of the muxing tester interface device 400 in the manner presented by the test head 216 and pin electronics circuitry. Although the muxing tester interface device 400 connects in same conventional manner to the pin electronics cards 218 of the test head 216, the muxing tester interface device 400, rather than providing test socket(s) for DUTs, connects to one or more of the load boards 500 (shown as load board 500a and 500b in FIG. 3).

The muxing tester interface device 400 is, for example, a circuit board including the mating connectors 402. Each mating connector 402 connectively mates to a tester pin of one of the pin electronics card 218 of the test head 216. A respective relay device 404 of the muxing tester interface device 400 is connected to each respective mating connector 402. Paired sets of a respective first circuit 406 and a respective second circuit 408 of the muxing tester interface device 400 uniquely connect to each respective relay device 404, such that the relay device 404 for the particular mating connector 402 switchably communicatively connects that mating connector 402 to either the first circuit 406 or the second circuit 408 of the paired set for the mating connector 402. For each paired set of the first circuit 406 and the second circuit 408, the first circuit 406 and the second circuit 408 connect to a multi-lead connector 410 of the muxing tester interface device 400. The multi-lead connector 410 of the muxing tester interface device 400 is common for the paired sets of the first circuit 406 and second circuit 408 for all of the relay devices 404. The first circuit 406 and the second circuit 408 of each paired set are trace length matched.

The multi-lead connector 410 is connected to a first cable 312 which includes an independent circuit/wire (not shown in detail) connected to each first circuit 406 at the multi-lead connector 410 and to the load board 500a. In operation, relay devices 404 of the muxing tester interface device 400, when switched to connect the corresponding mating connectors 402 of those relay devices 404 to the corresponding first circuits 406 of the relay devices 404, connects each of the independent circuits/wires of the first cable 312 to the load board 500a. The multi-lead connector 410 is likewise connected to a second cable 314 which includes an independent circuit/wire (not shown in detail) connected to each second circuit 408 at the multi-lead connector 410 and to the load board 500b. When the relay devices 404 of the muxing tester interface device 400 are switched to connect the corresponding mating connectors 402 of those relay devices 404 to the corresponding second circuits 408 of the relay devices 404, each independent circuit/wire of the second cable 314 is connected to the load board 500b. The relay devices 404, by switching either to the first circuits 406 or the second circuits 408 at any instant, connect the tester resource signals from the pin electronics cards 218 of the test head 216 to the load board 500a or the load board 500b, respectively.

Each of the load boards 500a (or 500b) includes a multi-lead connector 502 for connection to independent wires/circuits of the first cable 312 for the load board 500a (or the second cable 314 for the load board 500b). Pin circuits 504 of the respective load board 500a (or 500b) connect each independent wire/circuit of the respective cable 312 (or 314) to a distinct pin 506 of a test socket 508 of the load board 500a (or 500b, as applicable). DUTs for testing by the ATE 201 are retrieved and transferred from input bin(s) 302 by the first handler 230 and the second handler 232. The first handler 230 deposits a DUT in the socket 508, relay devices 402 of the muxing tester interface device 400 switch to connect the pin electronics of the test head 216 to the load board 500a for testing of each respective distinct pin 506 by a distinct test resource per the applicable pin electronics card 218. During testing of the DUT in the socket 508 of the load board 500a, the second handler 232 transfers and deposits a next DUT for testing in a socket of the load board 500b. Upon completion of testing of the DUT in the socket 508, relay devices 402 of the muxing tester interface device 400 switch to connect the pin electronics of the test head 216 to the load board 500b for testing of each respective distinct pin of the socket of the load board 500b by the distinct test resource per the applicable pin electronics card 218. During testing of this next DUT in the socket of the load board 500b, the handler 230 removes the tested DUT in the socket 508 and transfers the tested DUT to applicable output bin(s) 304a. Testing by the ATE 201 is substantially continuous because at each instant one of the handlers 230 or 232 has deposited a to be tested DUT in a respective socket of respective load board 500a or 500b, and the muxing tester interface device 400 switches testing by the ATE 201 to the next respective load board 500a or 500b upon completion of testing in the other load board 500b or 500a.

Where the load boards 500a and 500b are substantially functionally the same, including all circuitry of the boards 500a, 500b is trace length matched, where the paired sets of first circuits 406 and second circuits 408 of the muxing tester interface device 400 are trace length matched, and where the first cable 312 and the second cable 314 provide substantially equivalent effects, the two handlers 230, 232 each operating with a respective load board 500a or 500b, in combination with multiplexing of tester resources by the muxing tester interface device 400 and respective load boards 500a, 500b, substantially eliminates index time in testing operations (and in every event significantly reduces index time during which the tester would otherwise not be testing while waiting for handler operations of retrieving, depositing, and dispensing with successive DUTs).

Muxing Tester Interface Device and Load Boards

Figure 4:
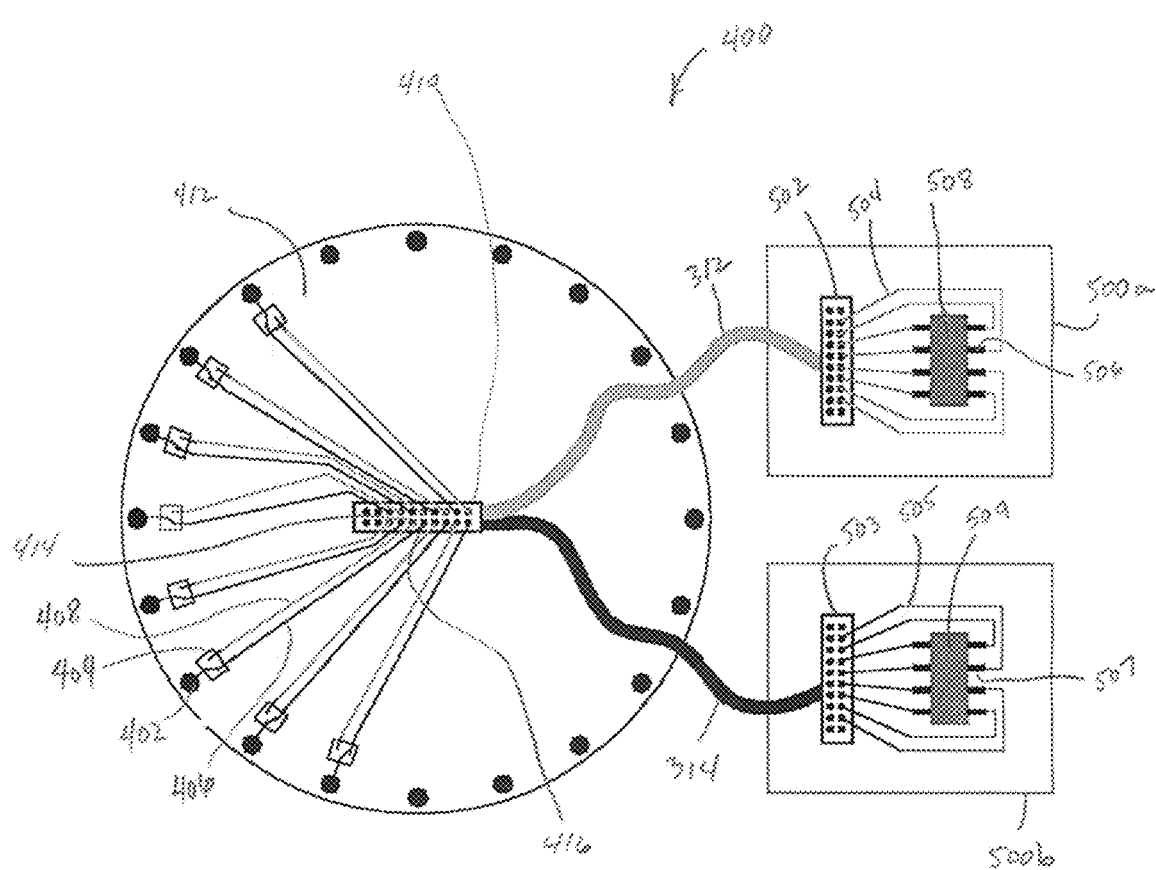
FIG. 4 illustrates the muxing tester interface device and load boards of FIG. 3, according to certain embodiments of the invention.

Referring to FIG. 4, in conjunction with FIGS. 2 and 3, the muxing tester interface device 400 is communicatively connected by the first cable 312 to the load board 500a and by the second cable 314 to the load board 500b. The muxing tester interface device 400 is, for example, a printed circuit board 412 including one or more mating connector 402. Each mating connector 402 of the printed circuit board 412 communicatively connects to a tester pin (or tester channel) circuit of an automatic test equipment, for example, such as the ATE 201. Each tester pin circuit is, for example, circuitry of one pin electronics card 218. The pin electronics card 218 is connected to the automatic test equipment, for example at the test head 216 of the ATE 201. The pin electronics card 218 provides connectors for a conventional load board having one or more sockets for connecting respective DUT(s) of the socket(s) to the automatic test equipment. The muxing tester interface device 400 has mating connectors 402 corresponding to the same connectors of the pin electronics cards 218 to which a conventional load board would be connected for testing of DUTs via the load board (i.e., if in conventional testing operation).

Each mating connector 402 connects to a relay device 404 of the muxing tester interface board 400. For example, each relay device 404 is formed in the printed circuit board of the mating connectors 402. Each relay device 404 connects to corresponding paired set of the first circuit 406 and the second circuit 408, and switches communicative connection of the relevant mating connector 402 to either the first circuit 406 or the second circuit 408 of the paired set. Each paired set of the first circuit 402 and the second circuit 408 connected correspondingly to the respective relay device 404 is, for example, formed in the printed circuit board of the relay device 404.

The first circuit 406 for each relay device 404 connects to the connector 410, and the connector 410 connects to the cable 312. The cable 312 includes a plurality of distinct circuits (not shown in detail). Each distinct circuit of the cable 312 connects to one first circuit 406 of one paired set and relay device 402. The cable 312 is, for example, a cable bundle of a plurality of wires, each wire being one distinct circuit. The cable 312 connects the muxing tester interface device 400 to the load board 500a (peripheral to the device 400).

The second circuit 408 for each relay device connects to the connector 410, and the connector 410 connects to the cable 314. The cable 314 includes a plurality of distinct circuits (not shown in detail). Each distinct circuit of the cable 314 connects to one second circuit 408 of one paired set and relay device 402. The cable 314 is, for example, also a cable bundle of a plurality of wires, each wire being one distinct circuit. The cable 314 connects the muxing tester interface device 400 to the load board 500b (peripheral to the device 400).

The first circuit 406 and the second circuit 408 of each paired set are trace length matched, or otherwise functionally and operationally (e.g., electrically) equivalent, including timing and synchronization, in communicating between the muxing tester interface device 400 and the first load board 500a and the second load board 500b, respectively. The respective distinct circuits of the cable 312 and 314 (i.e., the first circuit 406 and the second circuit 408 of each paired set) are also trace length matched, or otherwise functionally and operationally (e.g., electrically) equivalent in communicating between the muxing tester interface device 400 and the first load board 500a and the second load board 500b, respectively. In certain embodiments, the paired sets of the first circuit 406 and the second circuit 408 are printed traces of the printed circuit board 412 of the muxing tester interface device 400. Each respective distinct circuit included in each of the cables 312 and 314 is a separate shielded coaxial cable in certain embodiments, and the cables 312 and 314 respectively include, for the cable 312, a cable bundle of all coaxial cables connecting the plurality of first circuits 406 to the first load board 500a, and for the cable 314, a cable bundle all coaxial cables connecting the plurality of second circuits 408 to the second load board 500b.

In alternatives, the multi-lead connector 410 can be segregated as more than one component, such as a segregated connector for the first circuits and a separate segregated connector for the second circuits or otherwise. The multi-lead connector 410 is fixedly attached to the respective cables 312, 314, such that each distinct circuit of the respective cable 312 or 314 connects at a junction 416 to one of either the first circuits 406 in the case of the cable 312 or one of the second circuits 408 in the case of the cable 314. In alternatives, the multi-lead connector 410, whether unitary or segregated connectors, provides mating connections for corresponding connectors of the cables 312, 314, as applicable, which cables 312, 314 connect to the first load board 500a and the second load board 500b, respectively.

The first load board 500a includes the multi-lead connector 502 connected to each of the distinct circuits, for example, the bundled coaxial cables, of the cable 312. Each distinct circuit (i.e., each distinct circuit connected to a different respective one of the first circuit 406 of the muxing tester interface board 400) connects to a different respective one of the pin circuits 504 of the first load board 500a. Each pin circuit 504 connects to a different respective one of the pins 506 of the test socket 508 of the first load board 500a. The second load board 500b is similar and includes the multi-lead connector 503 connected to each of the distinct circuits, for example, the bundled coaxial cables, of the cable 314. Each distinct circuit (i.e., each connected to a different respective one of the second circuit 408 of the muxing tester interface board 400) connects to a different respective one of the pin circuits 505 of the second load board 500b, and each pin circuit 504 connects to a different respective pin 508 of the test socket 509 of the second load board 500b.

Each of the first load board 500a and the second load board 500b is, for example, a respective printed circuit board. Alternately the first load board 500a and the second load board 500b can be combined in a single printed circuit board or otherwise each separated into more than one device or board, in each event segregated to connect the first load board 500a to the first circuits 406 and the second load board 500b to the second circuits 500b. The multi-lead connectors 502, 503 are each fixedly attached to the respective cables 312, 314, or, in alternatives, provide mating connections for corresponding connectors of the cables 312, 314, as applicable.

In operation of the load boards 500a and 500b, the relay devices 404 of the muxing tester interface device 400 switchingly connect either the first circuits 406 to the first load board 500a or the second circuits 408 to the second load board 500b, depending on switch position of the relay devices 404 at each instant. During testing operations, a DUT (not shown) in the test socket 508 is tested when the relay devices 404 switchingly connect the ATE 201 tester resources supplied by pin electronics circuitry of the test head 216 at the mating connectors 402 to the respective first circuits 406. The respective first circuits 406 communicate these tester resources to the cable 312, and respective distinct circuits of the cable 312 communicate the resources to the first load board 500a and the respective pin 506 of the test socket 508 for each respective resource. Likewise, a next DUT (not shown) in the test socket 509 is tested when the relay devices 404, instead, switchingly connect the ATE 201 tester resources supplied by pin electronics circuitry of the test head 216 at the mating connectors 402 to the respective second circuits 408, the respective second circuits 408 communicate these tester resources to the cable 314, and respective distinct circuits of the cable 314 communicate the resources to the second load board 500b and the respective pin 507 of the test socket 509 for each respective resource.

Although the muxing tester interface device 400 is illustrated as a round-shaped printed circuit board including twenty mating connectors, the illustration is merely for purposes of example and explanation; in practice, the muxing tester interface device 400 can have shape substantially same as that of a conventional load board that would be useable for the particular automatic test equipment and its pin electronics and can include mating connectors 402 of any style, shape, type, or arrangement as required for connection to the automatic test equipment and its pin electronics in replacement of the conventional load board. Manufacture techniques for the muxing tester interface device 400 include those known for printed circuit boards, semiconductors, integrated circuits and others according to application and the particular automatic test equipment. The muxing tester interface device 400 is connectable to conventional automatic test equipment, without modification or change to the automatic test equipment, including the pin electronics cards 218 for testing need not be modified. Non-conventional automatic test equipment is not required, unless desired for the particular testing operation.

Furthermore, although the load boards 500a and 500b are each illustrated as a square-shaped printed circuit board including a single test socket with eight pins, the illustration is merely for purposes of example and explanation; in practice, each load board 500a, 500b can have shape and configuration as may be desired for the particular testing operation and the type of handler or handlers serving devices for test to the board 500a, 500b. In alternatives, some or all elements/components of the load boards can be included in the muxing tester interface device, if handler(s) allow for operating within limited space that may be available for DUT presentment to the muxing tester interface device. In certain embodiments where the ATE includes sufficient tester resources, each load board 500a, 500b can include more than one test socket for parallel testing of DUTs in each of the test sockets (i.e., simultaneously the same tests are performed by the ATE on each of the DUTs, such that respective identical test resources of the ATE connect to each same function pin of each of the sockets and DUTs in the sockets).

In other embodiments, more than two load boards may also be possible for testing operations if ATE resources are sufficient, wherein one or more handlers serve devices for test to the load boards. In such instance, the relay devices (or other muxers, as applicable) of the muxing tester interface device, as well as respective circuits for test resources to the respective load boards for testing of DUTs at each load board, are configured to provide appropriate switching between channels to each load board for the test resources, in similar manner to the foregoing. Certain embodiments of the load boards may be more suitable for particular type of handler or handlers. For example, load boards may be particularly configured to accommodate the particular handler or handlers operation. According to embodiments, one handler with dual (or more) manipulators for DUTs, as well as two (or more) separate independent handlers, can be employed for respective portions of a single lot of DUTs for testing or, alternately, for two (or more) separate lots of DUTs with one handler/manipulator operating for each separate lot of DUTs.

In certain embodiments, the load boards accommodate use with a variety of different types or models of handler or handlers and/or can be designed for a particular type or model of handler or handlers. For example, the muxing tester interface device and load boards, in accordance with the foregoing, are operable or can be configured for operation with wafer probers (i.e., multiplexed probers), gravity feed, rotary turret, strip test, and/or pick and place handler (s), and/or other robotic manipulators or equipment, as well as combinations of these. Although the ATE is described primarily as having operations, units, components and elements of an automatic test equipment for test of electronic devices, such as integrated circuits, semiconductors, and the like, similar or variations of automated test equipment can perform optical or other testing. The foregoing embodiments for reducing index time of robotic/mechanical equipment presenting devices for test to automatic test equipment, therefore, can be modified, supplemented, or otherwise varied in keeping with the foregoing for application to a wide variety of types of automatic test equipment and testing processes.

Although circuits connecting test resources at the test head of the ATE to the test sockets of the load boards have been described as trace length matched to ensure same behavior of paired sets of corresponding circuits to respective test sockets of load boards, other alternatives are possible to match function of each test resource of the ATE at each pin of respective test sockets of load boards, for example, additional electronics can be included in the muxing tester interface device, load boards, cables, or otherwise as needed to obtain functional equivalency. In certain embodiments, different function can be desired for respective sockets of load boards, for example, where accommodated by the automatic test equipment, test resources to one load board may desirably differ from test resources to another load board, such as in order to perform different types of testing via the same automatic test equipment (e.g., on separate lots or different types of devices at respective boards, such as parallel concurrent testing of respective devices at respective boards). Multiplexed handlers, in accordance with the embodiments, can reduced index time in many testing scenario variations.

Because mating connectors for connection to pin electronics of automatic test equipment are substantially same in the muxing tester interface device as those of a conventional load board for the particular automatic test equipment and its pin electronics, mating connectors of the muxing tester interface device can be any style, shape, type, or arrangement as required for connection to the automatic test equipment and its pin electronics in replacement of the conventional load board. The muxing tester interface device in these embodiments is connectable to conventional automatic test equipment, without modification or change to the automatic test equipment, including the pin electronics cards for testing need not be modified. Modifications to automatic test equipment are not required in the embodiments, and the test equipment can be of soft-dock, hard-dock or other type. The embodiments also accommodate single time domain tester, multiple time domain tester, or otherwise. Moreover, the embodiments are applicable (or can be adapted) for testing operation with future test equipment (including non-conventional test equipment or modified test equipment that may be employed or desirable for any particular testing process).

Handler Driver and Relay Device Control

Figure 5:
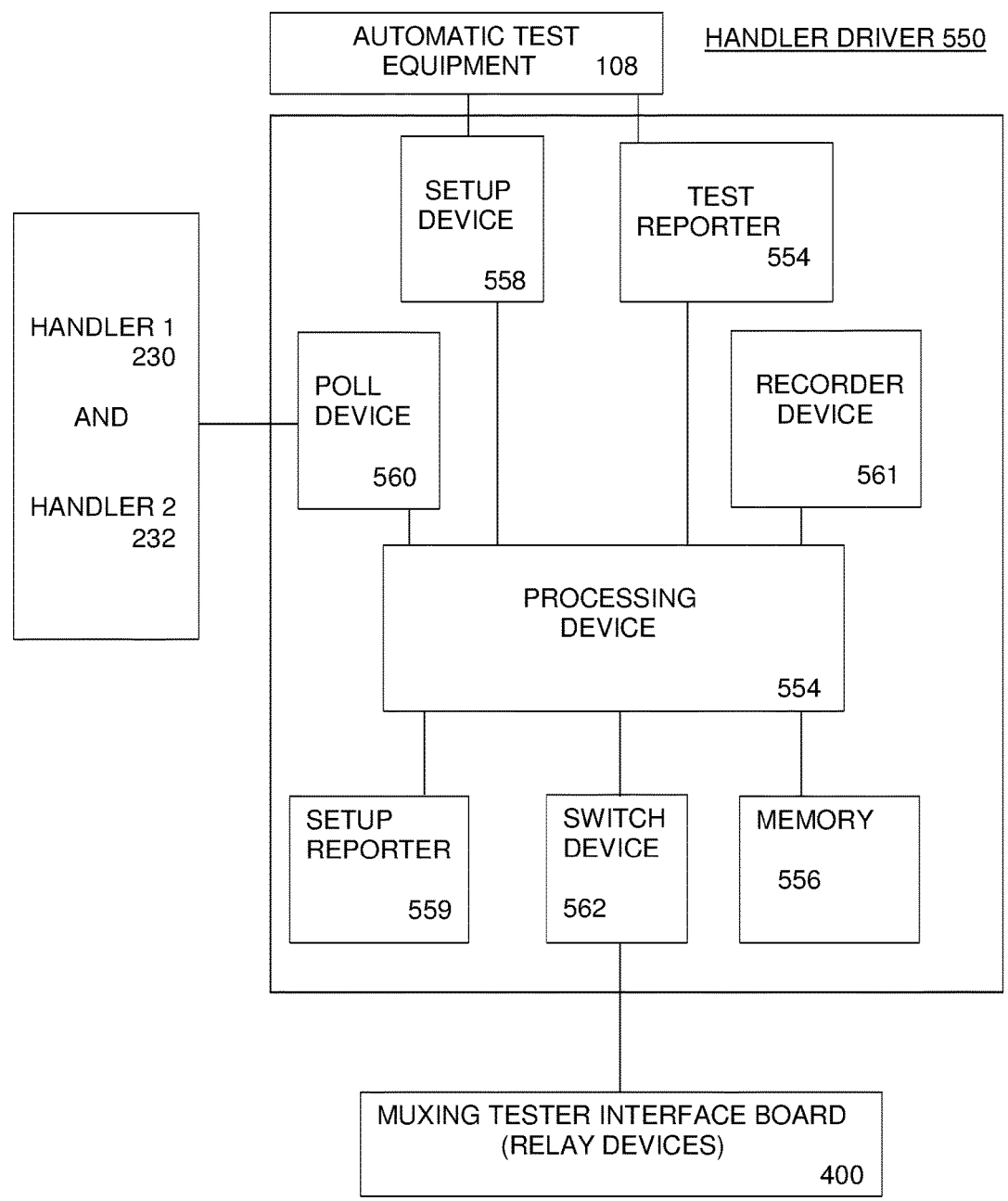
FIG. 5 illustrates a handler driving for controlling relay devices and multiplexed handlers, according to certain embodiments of the invention.

Referring to FIG. 5, in conjunction with FIGS. 1 through 4, a handler driver 550 communicatively connects to the relay devices of the muxing tester interface board 400 (i.e., as to FIG. 1, the Tester DIB 102). The handler driver 550 controls the relay devices to switchingly connect tester resources of pin electronics cards 218 of the ATE 201 (i.e., as to FIG. 1, the ATE 108) to either test sockets 244 or 246 (i.e., as to FIG. 1, sockets 124 or 126) of the first load board 500a or the second load board 500b, respectively (i.e., as to FIG. 1, Device DIB 112 or 114, respectively). The handler driver 550 also communicatively connects to the first handler 230 and the second handler 232 (i.e., as to FIG. 1, the first handler 104 and the second handler 106). The handler driver 550 independently controls the first handler 230 (i.e., as to FIG. 1, the first handler 104) and the second handler 232 (i.e., as to FIG. 1, the second handler 106), such that, substantially continuously for a set of DUTs for testing, the first handler transfers and deposits portions of the DUTs in the first load board 500a for testing and removes and dispenses the DUTs on completion of such testing and the second handler to transfers and deposits other portions of the DUTs in the second load board 500b for testing and removes and dispenses these DUTs on completion of such testing.

The handler driver 550 is, for example, the controller 118 of FIG. 1 or the multiplex controller 234 of FIG. 2. The handler driver 550 includes a processing device 554. The processing device 554 is, for example, a microprocessor or logic circuit. The processing device 554 is connected to memory 556 of the handler driver 550. The processing device 554 controls the memory 556 for storage of setup data and polling data respectively representing handler operation parameters (for each handler, such as the first handler 230 and the second handler 232 of FIGS. 2-3; or in reference to FIG. 1, the first handler 104 and the second handler 106) and handler operation status during operations (for each such handler, as later elaborated). The memory 556 is also controlled by the processing device 554 for storing data representing instructions employed for processing by the processing device 554 to control the handlers.

A setup device 558 of the handler driver 550 is connected to the processing device 554. The setup device 558 is controlled by the processing device 554 to access the setup data from automatic test equipment (or other source) communicatively connected to the setup device 558. The setup data represents DUTs to be tested, for example, lot information for the DUTs, initialization parameters for the DUTs and relevant relay devices and handlers for the DUTs of the lot (or respective lots, if more than one for testing), and data log for the DUTs.

The handler driver 550 includes a setup reporter 559 and a recorder device 561, each connected to the processing device 554. The setup reporter 559 is controlled by the processing device 554, responsive to the setup device 558 accessing the setup data. The setup reporter 559 is communicatively connected to the handlers. A record of the setup data is maintained by the processing device 554 in the recorder device 561. As controlled by the processing device 554 responsive to the setup device 558, the setup reporter 559 supplies to the respective handler that will present to-be-tested DUTs to the ATE for testing, a respective DUT data for each to-be-tested DUT. A record of the respective DUT data is maintained by the processing device 554 in the recorder device 561. Upon handling of each to-be-tested DUT by the handler and testing of the DUT by the ATE, the record of respective DUT data for the DUT is updated by the processing device 554 in the recorder device 561. The recorder device 561 maintains the record for each DUT for correlation of ATE test results for the DUT to the dispensation of the DUT by the handler after testing is completed. For example, the DUT data is used by the handler, in conjunction with the ATE, to correlate each test result to its applicable DUT and to track the DUT's location by the handler in output bin after testing. This DUT data may be further communicated to other devices, such as, for example, a computer workstation of the ATE for reporting.

A poll device 560 of the handler driver 550 is also connected to the processing device 554. The poll device 560 is communicatively connected to the handlers, for example, to each of the first handler 230 (i.e., 104 in FIG. 1) and the second handler 232 (i.e., 106 in FIG. 1). The processing device 554, in accordance with the setup data from the setup device 558, controls the poll device 560 to check status of each of the first handler 230 (i.e., 104) and the second handler 232 (i.e., 106), respectively. The poll device 560 detects status of each handler as: (1) then presenting DUT(s) undergoing testing in the test socket(s) of the load board for that handler ("Testing1"); (2) then presenting DUT waiting to be tested in the test socket of the load board for that handler ("Waiting2"); or (3) no DUT then presented in the test socket of the load board for that handler but testing then completed on DUT at the test socket of the load board of the other handler ("Done3").

The handler driver 552 includes a test reporter 564. The test reporter 564 is connected to the processing device 554 and is communicatively connected to the ATE. The test reporter 564, controlled by the processing device 554 responsive to poll device 560 on detection of Done3 status of the handlers, communicates to the ATE the respective DUT data for the DUTs then handled by the handlers in completed testing by the ATE. The DUT data communicated includes output bin location for correlation of applicable test result to the respective tested DUT in the bin location.

A switch device 562 of the handler driver 552 is connected to the processing device 554 and is communicatively connected to the relay devices of the muxing tester interface board 400. The switch device 562 is controlled by the processing device 554 to switch the relay devices to connect the respective test resources of the pin electronics of the automatic test equipment at the mating connectors to all (or respective ones, in certain alternatives) of either the first circuits 406 or the second circuits 408. This, in effect, switches testing by the automatic test equipment to DUTs (or DUT) in sockets (or socket) of either the first load board 500*a* (i.e., Device DIB 112 in FIG. 1) or the second load board 500*b* (i.e., Device DIB 114 in FIG. 1).

Testing1:

If the poll device 560 detects status at one of the handlers as Testing1 (described above), the processing device 554 controls the switch unit 562 to maintain then current switched state of the relay devices 402.

Waiting2:

If the poll device 560 instead detects status at one of the handlers as Waiting2 (described above), the processing device 554 controls the switch unit 562 to maintain then current switch of the relay devices 402 if status of the other handler is Testing1. However, upon the poll device 560 detecting status of that other handler as other than Testing1, the processing device 554 respondingly controls the switch unit 562 to switch the relay devices 402. On switch of the relay devices 402 by the switch unit 562, testing by the ATE commences at the handler then having status of Waiting2 and the poll device 560 thereafter detects status of this handler as Testing1 (until testing by the ATE as to DUT(s) for the handler is completed).

Done3:

If the poll device 560 detects status at one of the handlers as Done3 (described above), the processing device 554 halts handling by that handler. Handling and testing by the other handler continues, until status of this other handler is also Done3. When the poll device 560 detects status of the handlers as Done3, the processing device 554, responsive to the poll device 560, controls the test reporter 564 to communicate test results for each tested DUT to the ATE.

Although the handler driver 550 is illustrated in FIG. 5, as well as in FIGS. 1 and 2, as a unitary and segregated device connected to the handlers and test equipment, such illustration is for purpose of explanation. In certain embodiments, the handler driver 550 can instead be more than one unit or segregated device. In alternatives, individual portions or devices of the handler driver 550 can be unitized or segregated as separate unit(s) or device(s). In other alternatives, the handler driver 550, or portions or devices of the handler driver 550, can be implemented in hardware and/or and software devices of handlers, ATE, computer workstation, or other elements of the embodiments of Figures. The handler driver 550 can further be or include combinations of any of the foregoing. For example, if the handlers and/or the test equipment include adequate processing, timing, and storage devices and circuits for driving the handlers in the embodiments, the handler driver 550 (or portions of it) is the handler(s), test equipment, or combinations, as applicable. In other examples, one or more peripheral or incorporated device communicatively connected to the handler(s) and/or the test equipment, such as the computer 216 of FIG. 2 or other device or devices, is the handler driver 550, or all or portions of the relay controller unit 552, the handler controller unit 554, or combinations, as applicable. The handler driver 550, in whole or part, can be or include software in a memory processed by a computer, circuits, or connected computers or circuits, and combinations of these and/or other devices.

Figure 6:
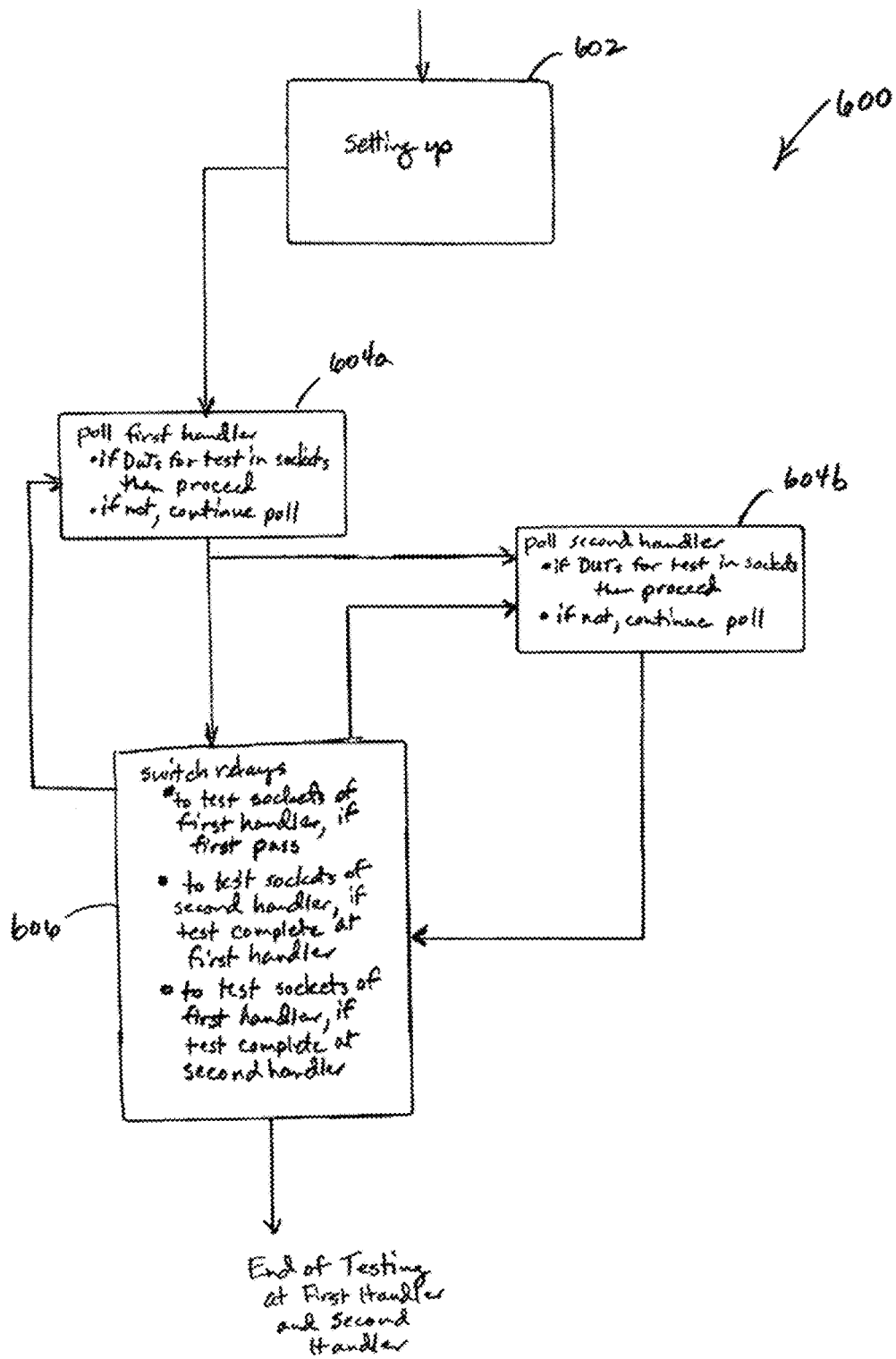
FIG. 6 illustrates a method of driving multiplexed handlers, according to certain embodiments of the invention.

Driver Method:

Referring to FIG. 6, a method 600 of driving multiplexed handlers, for example, a first handler and a second handler presenting devices to a tester interface including a muxing tester interface board/Tester DIB and load boards/Device DIBS according to the embodiments, includes a step 602 of setup and initialization. The handlers multiplexed via the method 600 each operate to communicate start-of-test ('Start") to a connected automatic test equipment (ATE) when the handler has positioned a DUT for testing in a test socket connected to tester resources of the ATE and can be detected as status of end-of-test ("End") when testing of the DUT is completed by the ATE and the handler removes the DUT from the test socket responsive to completion of the testing. Handlers, by convention, communicate the Start and have detectable End status accordingly; however, handlers lacking such capability (if any) may be configured (including, for example, by modification, or connection to other devices) according to the embodiments for operation in the embodiments.

In the step 602, setup and initialization data is accessed, for example, from the ATE or a computer connected to or otherwise operative for the ATE. The setup and initialization data represents to-be-tested DUTs for handling by the handlers, including, for example, lot information for the DUTs, initialization parameters for the DUTs and relevant relay devices and the handlers for the DUTs of the lot (or respective lots, if more than one for testing), and data log for the DUTs. For multiplexing the two handlers, setup and initialization data for the first handler corresponds to the first handler and the DUTs for handling by that first handler and setup and initialization data for the second handler corresponds to the second handler and the DUTs for handling by that second handler. For example, the first handler and the second handler can each handle a separate portion of a particular lot of DUTs, or the first handler can handle one lot of DUTs and the second handler can handle a second lot of DUTs. The step 602 can accommodate various DUT handling (e.g., as desired in the testing operation, for lots, portions of same lot, test(s) on respective lots or portions, etc.) by each handler in embodiments.

After the step 602, one of the handlers (for example and explanation, the first handler) commences handling first DUTs for testing, by transferring the DUTs and depositing them in the respective test sockets of the load board for that first handler. Once the DUTs are positioned in the test sockets, the first handler communicates Start to the ATE and the ATE commences testing the DUTs.

In the method 600, steps of polling 604a the first handler and of polling 604b the second handler follow the step 602 and commencement by the first handler of operation for handling DUTs for testing. In the steps of polling 604a, 604b, status of the first handler and the second handler, respectively, as either Testing1, Waiting2 or Done3 (as previously described) determined for each handler.

At start of handling by the first handler of DUTs, the first handler moves DUTs and deposits them in test sockets of the load board for the first handler and signals Start of testing to the ATE. The step of polling 604a, thus, detects status of the first handler as Testing1$_{first}$ (i.e., subscript "first" indicating for the first handler, rather than the second handler) and polling 604a continues. Simultaneously, the second handler commences moving other DUTs and depositing them in test sockets of the load board for the second handler in order for testing these DUTs to commence at the second handler once testing is completed at the first handler. The step of polling 604b detects status of the second handler as Waiting2$_{second}$ (i.e., subscript "second" indicating for the second handler, not the first handler) once the DUTs handled by the second handler are positioned in test sockets for the second handler and while status of the first handler remains Testing1$_{first}$ (i.e., while testing by the ATE proceeds at the first handler).

Upon completion of testing DUTs at the first handler, the step of polling 604b immediately detects status of the second handler as Waiting2$_{second}$ and the first handler removes the just tested DUTs from test sockets at the first handler and communicates End and bin data for the tested DUTs to the ATE. The ATE recognizes the End and can immediately begin next testing, after receiving Start (from one of the handlers). The first handler, on communicating End and bin data, transfers and deposits next to-be-tested DUTs in test sockets at the first handler (including while testing is performed by the ATE at the second handler, as next described).

In a step 606, tester resources are switched, for example, via the relay devices 402, for testing of DUTs then positioned in test sockets at the second handler and Waiting2$_{second}$. The second handler communicates Start to the ATE and testing commences in the test sockets at the second handler. The step of polling 604b then detects status of the second handler as Testing1$_{second}$. The step of polling 604a continues as to the first handler and detects status of the first handler as Waiting2$_{first}$, once next to-be-tested DUTs are positioned in test sockets at the first handler.

Upon completion of testing DUTs at the second handler, the step of polling 604a immediately detects status of the first handler as Waiting2$_{first}$ and the second handler removes the just tested DUTs from test sockets at the second handler and communicates End and bin data for the tested DUTs at the second handler to the ATE. The ATE recognizes the End and can immediately begin next testing, after receiving Start (from one of the handlers; particularly, the first handler in the described arrangement). The second handler, on communicating End and bin data, transfers and deposits its next to-be-tested DUTs in test sockets at the second handler (including while testing is performed by the ATE at the first handler, as has been described).

Polling 604a, 604b continues for each handler, respectively, unless and until no further DUTs are available to the handler for transfer and deposit in its test sockets for testing by the ATE. Upon either handler having communicated End and bin data for tested DUTs and thereafter no further DUTs remaining for testing at the sockets of the handler, the step of polling 604a or 604b, as applicable for first handler or second handler, detects Done3$_{first}$ or Done3$_{second}$, respectively. If Done3$_{first}$ is detected in the polling 604a, handling by the first handler and testing by the ATE at test sockets for the first handler is stopped. If Done3$_{second}$ is detected in the polling 604b, handling by the second handler and testing by the ATE at test sockets for the second handler is stopped. If both Done3$_{first}$ and Done3$_{second}$ have been detected in the steps of polling 604a and 604b, testing by the test equipment stops (unless and until again commenced with other DUTs and restart of the method 600).

The method 600 therefore provides continuous operation of test equipment for a testing process, the test equipment either testing devices at one handler or the other until all devices are tested. Index time for the testing is reduced or eliminated by the method 600 through switch of relays for testing in continuous sequence at one or the other handler at each instant. The method 600 multiplexes the handlers in manner that allows one handler to be operating for testing while the other handler is indexing, and vice versa, and for switching relays to apply tester resources for testing at one and then the other handler in continuous operations.

EXAMPLES

Figure 7:
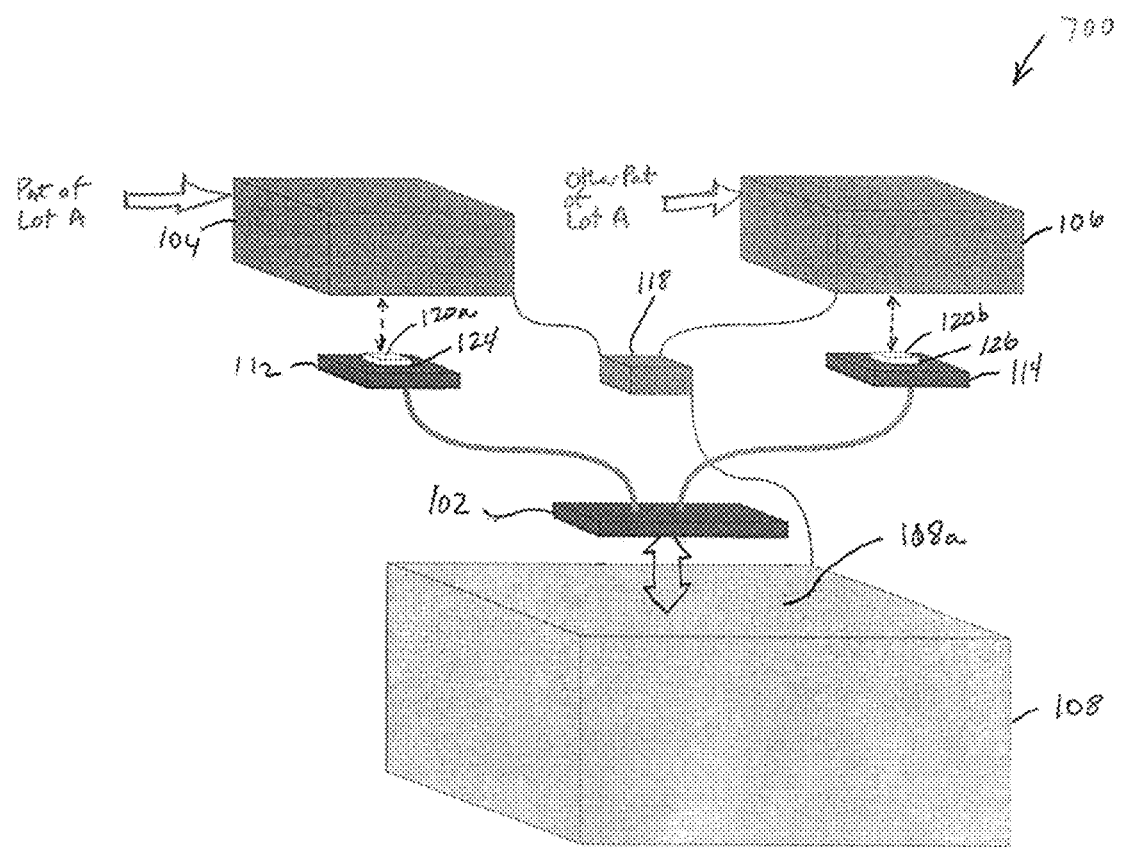
FIG. 7 illustrates a single lot test system, according to certain embodiments of the invention.

Referring to FIG. 7, a single lot test system 700 in accordance with the embodiments, for example, the system 100 of FIG. 1 or those of FIGS. 2-5, includes the Tester DIB 102 connected to the test head 108a of the ATE 108 in place of a load board and connected to Device DIB 112 with test socket 124 and Device DIB 114 with test socket 126. The first handler 104 operative for the Device DIB 112 and the second handler 106 operative with the Device DIB 114 each connect to the multiplex controller 118, and the multiplex controller 118 connects to the ATE 108.

In operation, the first handler 104 transfers and deposits respective DUTs of part of a lot (Lot A) of the DUTs in the test socket 124 for testing via the ATE 108, and removes DUTs from the test socket 124 and dispenses with them after testing is completed. The second handler 106 transfers and deposits respective DUTs of the other part of Lot A in the test socket 126 for testing via the ATE 108, and removes DUTs from the test socket 126 and dispenses with them after testing is completed. The first and second handlers 104, 106, for example, obtain DUTs for testing from one or more bin containing Lot A and dispense with the DUTs once tested in one or more output bin, such as output bin for DUTs that pass testing and output bin for DUTs that fail or are rejected in testing. The output bin (or bins) for each handlers 104, 106 may be segregated from those of the other handler, and each tested DUT output identifiable with its particular test result as binned. If same output bin(s) for both handlers 104, 106 are employed, the multiplex controller 118, a computer connected to the ATE 108, processors of the handlers or ATE, or other device provides identification of each tested DUT with its respective test result.

The first handler 104 and the second handler 106 operate in continuous succession for each respective portion of DUTs of Lot A. The handlers 104, 106 are multiplexed, for example, according to the method 600 of FIG. 6, for continuous testing by the ATE 108 at either the test socket 124 for the first handler 104 or the test socket 126 for the second handler at each instant during which testing is not completed for all DUTs of Lot A.

The single lot test system 700 provides for parallel testing of DUTs at each Device DIB 112, 114 if the Device DIBs 112, 114 each include more than one test socket, the ATE 108 has sufficient test electronics for parallel testing, and the first and second handlers 104, 106 each can manipulate numbers of DUTs for the test sockets of each Device DIB 112, 114.

Figure 8:
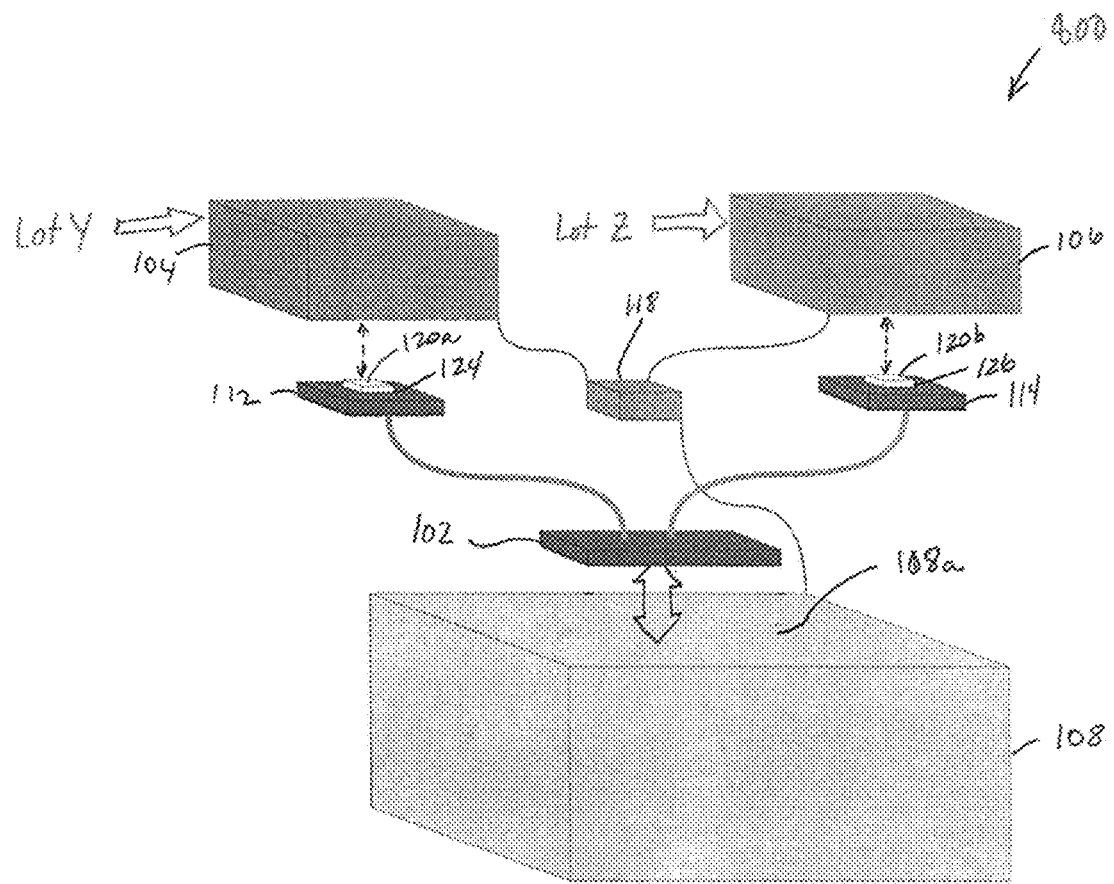
FIG. 8 illustrates a multiple lot test system, according to certain embodiments of the invention.

Referring to FIG. 8, a multiple lot test system 800 in accordance with the embodiments, for example, the system 100 of FIG. 1 or those of FIGS. 2-5, includes the Tester DIB 102 connected to the test head 108a of the ATE 108 in place of a load board and connected to Device DIB 112 with test socket 124 and Device DIB 114 with test socket 126. The first handler 104 operative for the Device DIB 112 and the second handler 106 operative with the Device DIB 114 each connect to the multiplex controller 118, and the multiplex controller 118 connects to the ATE 108. The ATE 108 provides testing for two distinct lots of DUTs (Lot Y and Lot Z). Various options are presented by the system 800 for testing Lot Y, on the one hand, and Lot Z, on the other hand. Lot Y and Lot Z can be tested identically by the ATE 108 in similar manner as described with respect to the single lot test system 700 of FIG. 7, but with one handler operating with respect to Lot Y and the other handler with respect to Lot Z (rather than each handler portions of a single lot). Alternately, the ATE 108 can differently test Lot Y DUTs versus Lot Z DUTs, if the ATE 108 has sufficient test resource electronics and memory for dual pattern (i.e., vector) sets, one for test of Lot Y DUTs and one for test of Lot Z DUTs, and can quickly alternate between the tests of Lot Y and Lot Z. In other alternatives, the test sockets 112 for Lot Y may be different in number than the test sockets 114 for Lot Z, requiring the first and second handlers 104 and 106 to each operate accordingly and the ATE 108 to test different numbers of DUTs in Lot Y and Lot Z in alternating testing.

In operation, the first handler 104 transfers and deposits respective DUTs of one lot (Lot Y) in the test socket 124 for testing via the ATE 108, and removes the DUTs from the test socket 124 and dispenses with them after testing is completed. The second handler 106 transfers and deposits respective DUTs of the other lot (Lot Z) in the test socket 126 for testing via the ATE 108, and removes the DUTs from the test socket 126 and dispenses with them after testing is completed. The first handler 104, for example, obtains DUTs of Lot Y for testing from one or more bin containing Lot Y and dispenses with the DUTs once tested in one or more output bin, such as output bin for the DUTs that pass testing and output bin for the DUTs that fail or are rejected in testing for Lot Y. The second handler 106, for example, obtains DUTs of Lot Z for testing from one or more bin containing Lot Z and dispenses with these DUTs once tested in output bins for Lot Z. Each tested DUT of Lot Y is output binned by the first handler 104 identifiable with its particular Lot Y test result, and each tested DUT of Lot Z is output binned by the second handler 106 identifiable with its particular Lot Z test result.

The first handler 104 operates in continuous succession for respective DUTs of Lot Y, and the second handler 106 operates in continuous succession for respective DUTs of Lot Z. The handlers 104, 106 are multiplexed, for example, according to the method 600 of FIG. 6, for continuous testing by the ATE 108, alternating testing at either the test socket 124 for the first handler 104 or the test socket 126 for the second handler at each instant. The multiple lot test system 800 provides for parallel or parallel concurrent testing of DUTs of the respective Lots at the Device DIBs 112, 114, respectively. In parallel concurrent testing, different tests are performed by the same ATE 108, for example, particular test on DUTs at the Device DIB 112 and different particular test on DUTs at the Device DIB 114. Thus, different Lots may each be tested in alternating sequence, by same or different test (or other different effect in handling or otherwise) if the ATE 108 has sufficient test electronics for the alternating tests and/or the first and second handlers 104, 106, respectively, are capable of manipulating the Lot Y DUTs and the Lot Z DUTs, respectively, as required for the alternating tests.

Referring to FIG. 9, an exemplary comparison 900 illustrates a conventional test time 902 required for test of two DUTs by automatic test equipment operating with a single handler for DUT manipulation versus a multiplexed test time 904 for same test of two DUTs by automatic test equipment operating with multiplexed handlers for DUT manipulation in accordance with the embodiments. In the conventional test time 902, index times 902a and 902b, during which the automatic test equipment is idle and not testing because awaiting Start, is required by the single handler to retrieve and transfer a DUT to the test socket connected to the test equipment, deposit the DUT in the test socket, and then signal Start to the test system to commence testing the DUT in the socket and also required by the single handler to remove the DUT once tested and retrieve, transfer and deposit in the test socket a next DUT before signaling next Start to the test system to commence testing this next DUT. With multiple DUTs for testing, the index time, during which the test equipment sits idle and not testing, accumulates. By comparison in the multiplexed test time 904, although automatic test equipment tests for same time, index time is eliminated. Rather than delay between tests because of index time for handler operations, each multiplexed handler prepositions a next DUT for testing in the test socket for the handler during testing by the test equipment of a DUT in the test socket of the other handler. The testing by the test equipment alternates, from test of the socket for one handler to test at the socket for the other handler, in immediate succession for multiple DUTs. Although time required for testing by the test equipment is the same, absence of index time for multiplexed handlers eliminates (or reduces) idle time of the test equipment and testing of multiple DUTs requires less total test time.

Referring to FIG. 10A, a method 1000 of controlling relays and handlers in the embodiments includes a step of initializing two handlers 1002 ("handler 1" and "handler 2") with respective addresses and defaults. Handler 1 operating for a testing process of an automatic test equipment ("ATE") successively accesses, connects to test sockets connectable to the ATE for testing, and disconnects and outputs after testing, one or more DUTs from a group of DUTs ("L1");

and handler 2 in the testing process successively accesses, connects to test sockets connectable to the ATE for testing, and disconnects and outputs after testing, one or more DUTs from another group of DUTs ("L2"). The DUTs of group L1 are each substantially functionally the same except for variations caused in manufacture as would be shown by test results for the respective the DUTs, and the DUTs of group L2 are each substantially functionally the same except for variations caused in manufacture as would be shown by test results for the respective DUTs. The DUTs of group L1 can be functionally same as the DUTs of group L2. Or, the DUTs of group L1 can functionally differ from the DUTs of group L2. The DUTs of group L1 and the DUTs of group L2 can each be portions of a same lot of DUTs, or the DUTs of group L1 can be separate lot from the DUTs of group L2. In each testing process, handler 1 or handler 2, respectively, connects respective DUT(s) manipulated by that handler 1 or 2, respectively, to test sockets connectable to the ATE and for test in the test sockets. Also in each testing process, at the end of test by the ATE of DUT(s) connected to the ATE by handler 1 or handler 2, respectively, the handler 1 or 2 disconnects the tested DUT(s) from the respective test sockets and can retrieve and connect to those test sockets next successive DUT(s) of the group L1 or L2, respectively, to be ready for connecting to the ATE for test in same manner.

Once a handler 1 thread (or manipulation operation) commences (step 1004) to initiate handling of DUTs for a test operation with the ATE, the handler 1, as has been described (and as accords with conventional handler operations), accesses and connects to test sockets for testing one or more DUTs from the group L1 of DUTs. Once DUTs are connected to the test sockets, the method 1000 controls relays (as will be described) to connect the ATE to the test sockets for test of the DUTs. The ATE then tests the connected DUTs. The method 1000 operates in conjunction with the handler 1 thread and test by the ATE of connected DUTs. Relay and handler control via the method 1000 need not require modification of handlers, ATE or their respective operations. For this reason, step 1004 is included in the illustration of FIG. 10A for purpose of explanation and is referenced here within parentheses; but, such reference merely provides time sequence understanding and need not be a step of the method 1000 if handlers and ATE operate as described when not modified or varied (such as may be applicable for conventional handlers and ATE).

A step 1006 of polling handler 1 commences as handler thread 1 (step 1004) begins. In the step of polling 1006, the method 1000 determines whether binning (i.e., for DUTs having then been tested) is performed (no, in the case of initial DUTs for test at commencement of the test process; but yes, if test process has proceeded through completion of test of initial DUTs for handler 1 and handler thread 1 is then proceeding for any next succession of DUTs for handler 1) and polls handler 1 to determine when ready and waiting for test of DUTs connected to test sockets by handler 1 for switched connection to the ATE (e.g., handler 1 status of Waiting$2_{first}$, as earlier described). If the polling step 1006 determines handler 1 is performing handler thread 1 (step 1004, i.e., accessing DUTs for testing and has not positioned DUTs in test sockets), a step 1008 awaits the handler thread 1 (step 1004) until polled status of handler 1 indicates ready for testing (i.e., DUTs are connected to sockets which can be switchably connected to the ATE for test).

Once the polling step 1006 determines handler 1 status of ready for testing (e.g., Waiting$2_{first}$), the method 1000 proceeds to a step 1010 of switching to communicatively connect test by the ATE to test sockets for DUTs positioned by handler 1 in the sockets. In the switching step 1010, handler 1 test sockets are mapped as active sites and relays are switched to connect ATE pin electronics providing tester resources to the test sockets for handler 1 containing the DUTs to be tested. Also in the step 1010, a data record is written for the active sites.

Then, testing by the ATE commences on DUTs positioned by handler 1 in the relevant test sockets connected via relay to the tester resources. As mentioned, relay and handler control via the method 1000 need not require modification of handlers, ATE or their respective operations. For this reason, testing by the ATE on the DUTs for handler 1 in its test sockets, referenced in the illustration of FIG. 10A as "execute code on active sites only", is included in the illustration for purpose of explanation; but, such reference merely provides time sequence understanding and need not be a step of the method 1000 if the ATE operates as described when not modified or varied (such as may be applicable for conventional ATE) to automatically commence testing when DUTs are positioned in the test sockets by handler 1 and ready for testing because connected to the tester resources by switched relay as described.

Continuing in the step 1010, on test completion by the ATE of DUTs positioned by handler 1 and switchably connected to the ATE, the test sockets are next mapped to handler 1 as ready for next testing and binning for handler 1 is readied.

Handler 1 then commences operating through a next handler thread 1 (i.e., step 1004) as described, for next successive DUTs to be tested. Referring to FIG. 10B, in conjunction with FIG. 10A, the handler 1 in proceeding through handler thread 1 of step 1004, in each such step ascertains 1004a whether any next successive DUTs for testing remain of the group L1. If no next successive DUTs remain, the handler thread 1 ends. If additional DUTs remain to be tested in group L1, then the handler thread 1 continues with handler 1 operations of retrieving and positioning in the test sockets next successive DUTs of group L1 for testing and next succession of the steps 1006, 1008 and 1010 in the method 1000.

Continuing to refer to FIG. 10A, the method 1000 initializes and sets up handler 2, as well in the step 1002. In the method 1000, the step 1002 (and the step 1004 commencing first handler thread 1 to start a test process), a handler 2 thread (or manipulation operation) commences (step 1014) to initiate handling of DUTs of L2 by the handler 2 for test operation with the ATE. Handler 2, as has been described (and as accords with conventional handler operations), accesses and connects to test sockets associated with handler 2 (which can be different from the test sockets associated with handler 1) for testing one or more DUTs from the group L2 of DUTs. Once DUTs are connected by handler 2 its applicable test sockets, the method 1000 controls relays to connect the ATE to these test sockets for test of the DUT, in effect, alternating between testing for handler 1 and handler 2. The method 1000 operates in conjunction with the handler 2 thread and test by the ATE of connected DUTs. Because relay and handler control via the method 1000 need not require modification of handlers, ATE or their respective operations, step 1014 is also included in the illustration of FIG. 10A for purpose of explanation and is referenced here within parentheses; but, such reference merely provides time sequence understanding and need not be a step of the method 1000 if handlers and ATE operate as described when not modified or varied (such as may be applicable for conventional handlers and ATE).

A step 1016 of polling handler 2 commences as handler 2 thread (step 1014) begins. In the step of polling 1016, the method 1000 determines whether binning (i.e., for DUTs having then been tested) is performed (i.e., no, in the case of initial DUTs for test at commencement of the test process as to handler 2; but yes, if test process has proceeded through completion of test of initial DUTs for handler 2 and handler thread 2 is then proceeding for any next succession of DUTs for handler 2) and polls handler 2 to determine when ready and waiting for test of DUTs connected to test sockets by handler 2 for switched connection to the ATE (e.g., handler 2 status of Waiting$2_{second}$, but testing is being performed for DUTs of handler 1). If the polling step 1016 determines handler 2 is performing handler thread 2 (step 1014, i.e., accessing DUTs of L2 for testing and has not positioned the DUTs in applicable test sockets for handler 2), a step 1018 awaits the handler thread 2 (step 1014) until polled status of handler 1 indicates ready for testing (i.e., DUTs are connected to those sockets which can be switchably connected to the ATE for test).

Once the polling step 1016 determines handler 2 status of ready for testing (e.g., Waiting$2_{first}$ and testing completed for DUTs of handler 1), the method 1000 proceeds to a step 1020 of switching to communicatively connect test by the ATE to test sockets for DUTs positioned by handler 2 in the sockets associated with handler 2. In the switching step 1020, handler 2 test sockets are mapped as active sites and relays are switched to connect ATE pin electronics providing tester resources to the test sockets for handler 2 containing the DUTs to be tested. Also in the step 1020, a data record is written for the active sites.

Then, testing by the ATE commences on DUTs positioned by handler 2 in the relevant test sockets connected via relay to the tester resources. As mentioned, relay and handler control via the method 1000 need not require modification of handlers, ATE or their respective operations. For this reason, testing by the ATE on the DUTs for handler 2 in its test sockets, referenced in the illustration of FIG. 10A as "execute code on active sites only", is included in the illustration for purpose of explanation; but, such reference merely provides time sequence understanding and need not be a step of the method 1000 if the ATE operates as described when not modified or varied (such as may be applicable for conventional ATE) to automatically commence testing when DUTs are positioned in the respective test sockets by handler 2 and ready for testing because connected to the tester resources by switched relay as described.

Continuing in the step 1020, on test completion by the ATE of DUTs positioned by handler 2 and switchably connected to the ATE, the respective test sockets are next mapped to handler 2 as ready for next testing and binning for handler 2 is readied.

Handler 2 then commences operating through a next handler 2 thread (i.e., step 1014) as described, for next successive DUTs of L2 to be tested. Referring to FIG. 10C, in conjunction with FIG. 10A, the handler 2 in proceeding through handler thread 2 of step 1014, in each such step ascertains 1014a whether any next successive DUTs for testing remain of the group L2. If no next successive DUTs remain, the handler thread 2 ends. If additional DUTs remain to be tested in group L2, then the handler thread 2 continues with handler 2 operations of retrieving and positioning in the test sockets next successive DUTs of group L2 for testing and next succession of the steps 1016, 1018 and 1020 in the method 1000.

In operation of the method 1000, testing by the ATE proceeds first with DUTs of L1 supplied to test sockets by handler 1 and then immediately proceeds next with DUTs of L2 supplied to other test sockets by handler 2. The method 1000 switches relays to either the test sockets for handler 1 or the test sockets for handler 2, in alternating sequence, until all DUTs of L1 have been tested and all DUTs of L2 have been tested. Depending on test time required for respective tests by the ATE of DUTs of L1, on the one hand, and of DUTs of L2, on the other hand, as well as index time required for respective operations of handler 1 and handler 2, respectively, the ATE can be maintained substantially continuously testing either at test sockets of handler 1 for DUTs of L1 or at test sockets of handler 2 for DUTs of L2. Each handler indexes (i.e., manipulates respective DUTs into and out of respective sockets for the handler) while the other handler is employed in testing DUTs of this other handler then positioned in sockets for this other handler and connected to the ATE for testing. Thus, index time, that would otherwise be required for a handler to retrieve, transfer, deposit in sockets, maintain in sockets, and remove and dispense the DUTs, is substantially reduced or eliminated in the method 1000.

Attached as Appendix A and incorporated in this specification is an exemplary software program stored in a computer readable medium, for controlling relays and multiplexed handlers according to embodiments.

Without limitation of the foregoing and Appendix A, the Appendix B attached herewith supplements and is incorporated as part of this specification.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems and device(s), connection(s) and element(s) that may cause any benefit, advantage, or solution to occur or become more pronounced are not to be construed as a critical, required, or essential feature or element of any or all the claims. As used herein, the terms "comprises, "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A system for testing first devices and second devices, the system includes an automatic test equipment (ATE), comprising:
   a first load board including a first socket for connecting to at least one of the first devices for testing;
   a second load board including a second socket for connecting to at least one of the second devices for testing;
   a first handler for connecting at least one of the first devices to the first socket and disconnecting the at least one of the first devices on completion of testing, and successively connecting and disconnecting until all of the first devices are tested;

a second handler for connecting at least one of the second devices to the second socket and disconnecting the at least one of the second devices on completion of testing, and successively connecting and disconnecting until all of the second devices are tested;
a tester interface board communicatively connected to the ATE, the tester interface board includes a relay for communicatively connecting the ATE to one of either the first socket and the second socket; and
a controller connected to the first handler and the second handler and communicatively connected to the test interface board, the controller polls the first handler to detect whether any first device is connected by the first handler to the first socket for testing and polls the second handler to detect whether any second device is connected by the second handler to the second socket for testing, and switches connection of the ATE (i) to the first socket for testing if any first device connected by the first handler to the first socket is detected, unless the ATE is then connected to the second socket during testing, and (ii) to the second socket for testing if any second device connected by the second handler to the second socket is detected, unless the ATE is connected to the first socket during testing,
wherein the controller substantially eliminates testing index time by alternating testing of the first devices and the second devices when testing cycles of the first devices and the second devices are the same, and substantially eliminates testing index time by selectively testing the first devices and the second devices when the testing cycles of the first devices and the second devices are different,
wherein the controller records completed test results and a location for each of the first devices and the second devices in a recorder,
wherein when polling detects a status of testing being completed on one of the first socket and the second socket, the controller halts handling of the first handler or second handler, respectively, where the testing is completed, and
wherein when the polling detects the status of testing being completed on both the first socket and the second socket, the controller controls a test reporter to communicate test results for tested first devices and tested second devices stored in the recorder to the ATE.

2. A system for connecting a test pin of an automatic test equipment (ATE) to devices for testing, the system includes a first handler for manipulating a first portion of the devices and a second handler for manipulating a second portion of the devices, comprising:
a first wire;
a second wire;
a relay communicatively connected to a test pin and switchably communicatively connected to one of either the first wire and the second wire;
a first socket communicatively connected to the first wire, the first handler connecting at least one device of the first portion to the first socket;
a second socket communicatively connected to the second wire, the second handler connecting at least one device of the second portion to the second socket; and
a controller communicatively connected to the first handler, the second handler, and the relay,
wherein the controller selectably tests same device under test (DUT) lots in the first socket and the second socket, and different DUT lots in the first socket and the second socket,
wherein the relay switches communicative connection to the first wire if the first handler has connected at least one device of the first portion to the first socket and the ATE is not then communicatively connected to and testing at least one device of the second portion in the second socket,
wherein the relay switches communicative connection to the second wire if the second handler has connected at least one device of the second portion to the second socket and the ATE is not then communicatively connected to and testing at least one device of the first portion in the first socket,
wherein the controller records completed test results and a location for each of the first devices and the second devices in a recorder,
wherein when polling detects a status of testing being completed on one of the first socket and the second socket, the controller halts handling of the first handler or second handler, respectively, where the testing is completed, and
wherein when the polling detects a status of testing being completed on both the first socket and the second socket, the controller controls a test reporter to communicate test results for tested first devices and tested second devices stored in the recorder to the ATE, and
wherein the first wire and the second wire are trace length matched.

3. An interface device for a tester, comprising:
a plurality of pin electronics cards, the plurality of pin electronics cards includes a first part and a second part of the plurality of pin electronics cards, the first part providing a respective first test for testing of devices and the second part providing a respective second test for testing of devices;
a tester interface board communicatively connecting to the plurality of pin electronics cards, each respective one of the plurality of pin electronics cards communicatively connected to one of a plurality of respective relays of the tester interface board, the plurality of respective relays include a selectable first portion and a selectable second portion of the plurality of respective relays;
a first device interface board communicatively connecting to one or more of the devices, the first device interface board is communicatively connected to each one of the selectable first portion of the plurality of respective relays;
a second device interface board communicatively connecting to one or more of the devices, the second device interface board is communicatively connected to each one of the selectable second portion of the plurality of respective relays; and
a controller connected to the tester interface board for switching the selectable first portion of the plurality of respective relays to connect the tester to the first device interface board and the selectable second portion of the plurality of respective relays to connect the tester to the second device interface board,
wherein each relay of the plurality of respective relays connects a first circuit and a second circuit of a paired set, respectively, to the first part and the second part of the plurality of pin electronics cards, and
wherein the first device interface board is used to perform the first test and the second interface board is used to perform the second test, the second test being different from the first test, wherein the controller records completed test results and a location for each of the first devices and the second devices in a recorder, wherein when polling detects a status of testing devices being completed associated with one of the first part of the plurality of pin electronics cards and the second part of the plurality pin interface cards, the controller halts handling of the devices associated with the first part of the plurality of pin electronics cards or the second part of the plurality pin interface cards, respectively, where the testing is completed, and wherein when polling detects a status of testing being completed on devices being completed associated with the first part of the plurality of pin electronics cards and the second part of the plurality pin interface cards, the controller controls a test reporter to communicate test results for each tested first devices and each tested second devices stored in the recorder to the ATE.

4. The interface device of claim 3,
wherein the selectable first portion of the plurality of respective relays and the selectable second portion of the plurality of respective relays each communicatively may be alternatively connected to same respective ones of the plurality of pin electronics cards for same testing by the tester at the first device interface board and the second device interface board.

5. The interface device of claim 3,
wherein the selectable first portion of the plurality of respective relays and the selectable second portion of the plurality of respective relays each communicatively connect to different respective ones of the plurality of pin electronics cards for different testing by the tester at the first device interface board and the second device interface board.

6. The interface device of claim 3,
wherein some of the selectable first portion of the plurality of respective relays and some of the selectable second portion of the plurality of respective relays may be alternatively communicatively connected to same respective ones of the plurality of pin electronics cards for same testing by the tester at the first device interface board and the second device interface board, and others of the selectable first portion of the plurality of respective relays and others of the selectable second portion of the respective relays may be alternatively communicatively connected to different respective ones of the plurality of pin electronics cards for different testing by the tester at the first interface board and the second device interface board.

7. The interface device of claim 3,
wherein the controller responsively switches by detecting a first handler has connected devices to the first interface board and a second handler has connected devices to the second interface board, and
wherein devices are connected to the first interface board and the second interface board in alternating succession.

8. The interface device of claim 3,
wherein the controller multiplexes a first handler and a second handler, for testing by the tester at one of either the first device interface board and the second device interface board until the devices are all tested.

9. The interface device of claim 3,
wherein the controller multiplexes a first manipulator for the devices and a second manipulator for the devices, of a single handler having the first manipulator and the second manipulator, for testing by the tester at one of either the first device interface board and the second device interface board until the devices are all tested.

10. A method of testing devices, the method includes a first test and a second test of a tester, the first test requires a first test period for completion and the second test requires a second test period for completion, a first portion of devices is connected to the tester at a first interval, a second portion of devices is connected to the tester at a second interval, comprising:
connecting the first portion of devices in the first interval, for the first test;
first polling to detect if the first portion of devices is connected in the first interval and if the first test is completed in the first test period;
connecting the second portion of devices in the second interval, for the second test;
second polling to detect if the second portion of devices is connected in the second interval and if the second test is completed in the second test period;
communicatively connecting the first test to the first portion of devices if the first polling detects the first portion of devices connected in the first interval;
communicatively connecting the second test to the second portion of devices if the second polling detects the second portion of devices connected in the second interval; and
alternating, in succession, between (i) communicatively connecting the first test if the second polling detects the second test is completed and (ii) communicatively connecting the second test if the first polling detects the first test is completed when testing cycles of the first portion of devices and the second portion of devices are substantially the same,
wherein a controller records completed test results in a recorder for each device in a tested first portion of the first devices and for each device in a tested second portion of devices,
wherein when polling detects a status of testing being completed on one of the first portion of devices and the second portion of devices, the controller halts handling of a first handler or a second handler, respectively, where the testing is completed, and
wherein when the first polling and the second polling detect the status of the first test and the second test being completed, the controller controls a test reporter to communicate test results for tested first portion of devices and tested second portion of devices stored in the recorder to the tester.

11. The method of claim 10, further comprising:
controlling a first handler for the devices to commence the connecting the first portion of the devices in the first interval, for the first test; and
controlling a second handler for the devices to commence the connecting the second portion of the devices in the second interval, for the second test.

12. The method of claim 11,
wherein the first handler and the second handler are a first manipulator and a second manipulator, respectively, of a unitary handler equipment, further comprising:
controlling the handler equipment to operate the first manipulator for the devices to commence the connecting the first portion of the devices in the first interval, for the first test; and
controlling the handler equipment to operate the second manipulator for the devices to commence the connecting the second portion of the devices in the second interval, for the second test.

13. A method of connecting first devices and second devices to an automatic test equipment for testing of the first devices by a first test and testing of the second devices by a second test, comprising:
- connecting an interface board to test pins of the automatic test equipment;
- connecting a first load board to the interface board, for the first test to the first device;
- connecting a second load board to the interface board, for the second test to the second device;
- providing a first handler, the first handler connects the first devices to the first load board;
- providing a second handler, the second handler connects the second devices to the second load board;
- controlling the first handler to connect the first devices to the first load board;
- controlling the second handler to connect the second devices to the second load board;
- switchingly connecting the first test to the first load board if the first devices are connected to the first load board; and
- switchingly connecting the second test to the second load board if the second devices are connected to the second load board,
- wherein the first test and the second test are different tests,
- wherein the switchingly connecting the first test to the first load board is performed (i) when neither of the first test and the second test is completed, (ii) when the second test is completed, and (iii) when at least one of the first devices has been connected to the first load board in the controlling the first handler, and
- wherein the switchingly connecting the second test to the second load board is performed (i) when the first test is completed, and (ii) when at least one of the second devices has been connected to the second load board in the controlling the second handler,
- wherein a controller records completed test results and a location for each of the first devices and the second devices in a recorder,
- wherein when polling detects a status of testing being completed on first devices of the first load board and second devices of the second load board, the controller halts handling of the first handler or second handler, respectively, where the testing is completed, and
- wherein when the polling detects a status of testing being completed on both the first devices and the second devices, the controller controls a test reporter to communicate test results for tested first devices and tested second devices stored in the recorder to the automatic test equipment.

* * * * *

UNITED STATES PATENT AND TRADEMARK OFFICE
CERTIFICATE OF CORRECTION

PATENT NO.       : 9,753,081 B2
APPLICATION NO.  : 13/022341
DATED            : September 5, 2017
INVENTOR(S)      : Harold Roberts Page 1 of 1

It is certified that error appears in the above-identified patent and that said Letters Patent is hereby corrected as shown below:

On the Title Page

Abstract (Line 8), delete the term "the" before the expression "second wire".

Signed and Sealed this
Nineteenth Day of June, 2018

Andrei Iancu
*Director of the United States Patent and Trademark Office*